United States Patent
Manda et al.

(10) Patent No.: US 12,255,220 B2
(45) Date of Patent: *Mar. 18, 2025

(54) LIGHT RECEIVING ELEMENT AND ELECTRONIC APPARATUS

(71) Applicant: SONY SEMICONDUCTOR SOLUTIONS CORPORATION, Kanagawa (JP)

(72) Inventors: Shuji Manda, Kanagawa (JP); Ryosuke Matsumoto, Kanagawa (JP); Suguru Saito, Kanagawa (JP); Shigehiro Ikehara, Kanagawa (JP); Tetsuji Yamaguchi, Kanagawa (JP); Shunsuke Maruyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 141 days.

This patent is subject to a terminal disclaimer.

(21) Appl. No.: 18/156,189

(22) Filed: Jan. 18, 2023

(65) Prior Publication Data

US 2023/0223420 A1 Jul. 13, 2023

Related U.S. Application Data

(63) Continuation of application No. 16/956,128, filed as application No. PCT/JP2018/045704 on Dec. 12, 2018, now Pat. No. 11,616,093.

(30) Foreign Application Priority Data

Dec. 28, 2017 (JP) .................................. 2017-253637

(51) Int. Cl.
*H01L 27/146* (2006.01)

(52) U.S. Cl.
CPC .. *H01L 27/14669* (2013.01); *H01L 27/14623* (2013.01); *H01L 27/14685* (2013.01); *H01L 27/14694* (2013.01)

(58) Field of Classification Search
CPC ............. H01L 27/146; H01L 27/14605; H01L 27/14623; H01L 27/14665;
(Continued)

(56) References Cited

U.S. PATENT DOCUMENTS

| | | | |
|---|---|---|---|
| 5,185,272 | A | 2/1993 | Makiuchi et al. |
| 6,018,187 | A | 1/2000 | Theil et al. |

(Continued)

FOREIGN PATENT DOCUMENTS

| | | |
|---|---|---|
| CN | 107039479 A | 8/2017 |
| EP | 1102321 | 5/2001 |

(Continued)

OTHER PUBLICATIONS

International Search Report and Written Opinion for International (PCT) Patent Application No. PCT/JP2018/045704, dated Mar. 12, 2019, 7 pages.

(Continued)

*Primary Examiner* — Joshua Benitez Rosario
*Assistant Examiner* — John Lin
(74) *Attorney, Agent, or Firm* — Sheridan Ross PC

(57) ABSTRACT

A first light receiving element according to an embodiment of the present disclosure includes a plurality of pixels, a photoelectric converter that is provided as a layer common to the plurality of pixels, and contains a compound semiconductor material, and a first electrode layer that is provided between the plurality of pixels on light incident surface side of the photoelectric converter, and has a light-shielding property.

20 Claims, 24 Drawing Sheets

(58) Field of Classification Search
CPC ......... H01L 27/14669; H01L 27/14685; H01L 27/14694
See application file for complete search history.

(56) References Cited

U.S. PATENT DOCUMENTS

| | | |
|---|---|---|
| 6,396,118 B1 | 5/2002 | Theil et al. |
| 2005/0007473 A1 | 1/2005 | Theil et al. |
| 2009/0166807 A1 | 7/2009 | Yamatoya et al. |
| 2012/0298957 A1 | 11/2012 | Iguchi et al. |
| 2013/0264671 A1 | 10/2013 | Yun et al. |
| 2013/0328013 A1 | 12/2013 | Inazu et al. |
| 2013/0341694 A1 | 12/2013 | Maekawa et al. |
| 2014/0117486 A1 | 5/2014 | Doi |
| 2016/0035921 A1 | 2/2016 | Matsuda et al. |
| 2016/0093657 A1 | 3/2016 | Ryoki |
| 2020/0321386 A1 | 10/2020 | Manda et al. |

FOREIGN PATENT DOCUMENTS

| | | |
|---|---|---|
| EP | 2434557 | 3/2012 |
| JP | S62-013066 | 1/1987 |
| JP | S62-018757 | 1/1987 |
| JP | 2001-257336 | 9/2001 |
| JP | 2011-146603 | 7/2011 |
| JP | 2011-204920 | 10/2011 |
| JP | 2014-060380 | 4/2014 |
| WO | WO 2014/045540 | 3/2014 |

OTHER PUBLICATIONS

Partial European Search Report for European Patent Application No. 18895966.2, dated Jan. 13, 2021, 11 pages.
Official Action for U.S. Appl. No. 16/956,128, dated Dec. 27, 2021, 16 pages.
Official Action for U.S. Appl. No. 16/956,128, dated Jun. 10, 2022, 17 pages.
Official Action for U.S. Appl. No. 16/956,128, dated Sep. 9, 2022, 18 pages.
Notice of Allowance for U.S. Appl. No. 16/956,128, dated Nov. 16, 2022, 9 pages.

LIGHT RECEIVING ELEMENT AND ELECTRONIC APPARATUS

CROSS-REFERENCE TO RELATED APPLICATIONS

This application is a continuation of U.S. patent application Ser. No. 16/956,128 filed Jun. 19, 2020 which is a national stage application under 35 U.S.C. 371 and claims the benefit of PCT Application No. PCT/JP2018/045704 having an international filing date of 12 Dec. 2018, which designated the United States, which PCT application claimed the benefit of Japanese Patent Application No. 2017-253637 filed 28 Dec. 2017, the entire disclosures of each of which are incorporated herein by reference.

PRIOR ART

At least one specification heading is required. Please delete this heading section if it is not applicable to your application. For more information regarding the headings of the specification, please see MPEP 608.01(a).

BACKGROUND OF THE INVENTION

Technical Field

The present disclosure relates to a light receiving element to be used, for example, for an infrared sensor or the like, and an electronic apparatus including the same.

Background Art

In recent years, as an image sensor (infrared sensor) having sensitivity to an infrared region, a semiconductor element (light receiving element) in which a photoelectric conversion layer is formed using a compound semiconductor has been developed. In the image sensor using the semiconductor element, similarly to a light receiving element using Si, in a case where a light-shielding film is not disposed between pixels, leakage of light from an adjacent pixel region occurs and color mixture occurs.

In contrast, for example, PTL 1 discloses a photoelectric conversion device in which a transparent electrode layer is provided over a photoelectric conversion layer using a compound semiconductor, and a light-shielding film is disposed over an upper layer thereof.

CITATION LIST

Patent Literature

PTL 1: Japanese Unexamined Patent Application Publication No. 2014-60380

SUMMARY OF THE INVENTION

Incidentally, in the infrared sensor using such a light receiving element, it has been desired to improve sensitivity.

It is desirable to provide a light receiving element and an electronic apparatus that make it possible to improve sensitivity.

A first light receiving element according to an embodiment of the present disclosure includes a plurality of pixels, a photoelectric converter that is provided as a layer common to the plurality of pixels, and contains a compound semiconductor material, and a first electrode layer that is provided between the plurality of pixels on light incident surface side of the photoelectric converter, and has a light-shielding property.

A first electronic apparatus according to an embodiment of the present disclosure includes the above-mentioned first light receiving element according to an embodiment of the present disclosure.

A second light receiving element according to an embodiment of the present disclosure includes a plurality of pixels, a photoelectric converter that includes a compound semiconductor material, is provided as a layer common to the plurality of pixels, and has a stacked structure in which a photoelectric conversion layer, a first contact layer, and a second contact layer are stacked, the photoelectric conversion layer being provided between the first contact layer and the second contact layer, an insulating layer provided over the photoelectric converter, and a transparent electrode layer provided over the insulating layer.

A second electronic apparatus according to an embodiment of the present disclosure includes the above-mentioned second light receiving element according to an embodiment of the present disclosure.

In the first light receiving element and the first electronic apparatus according to the respective embodiments of the present disclosure, the first electrode layer having a light-shielding property is provided between the plurality of pixels on the light incident surface side of the photoelectric converter. This eliminates the necessity of forming a transparent electrode over the photoelectric converter. In the second light receiving element and the second electronic apparatus according to the respective embodiments of the present disclosure, the insulating layer and the transparent electrode layer are stacked in this order over the photoelectric converter having a stacked structure in which the first contact layer, the second contact layer, and the photoelectric conversion layer are stacked, the photoelectric conversion layer being provided between the first contact layer and the second contact layer. Thus, it is possible to reduce a thickness of the first contact layer.

According to the first light receiving element and the first electronic apparatus of the respective embodiments of the present disclosure, since the first electrode layer having a light-shielding property is provided between the plurality of pixels on the light incident surface side of the photoelectric converter, it is not necessary to form a transparent electrode over the photoelectric converter. According to the second light receiving element and the second electronic apparatus of the respective embodiments of the present disclosure, since the transparent electrode is formed over the photoelectric converter via the insulating layer, it is possible to reduce a thickness of the first contact layer provided on the light incident surface side of the photoelectric converter. Thus, it is possible for the first light receiving element and the first electronic apparatus according to the respective embodiments of the present disclosure and the second light receiving element and the second electronic apparatus according to the respective embodiments of the present disclosure to improve sensitivity.

It is to be noted that the above description refers to examples of the present disclosure. Effects of the present disclosure are not limited to those described above, and may be other different effects or may further include other effects.

DETAILED DESCRIPTION OF THE INVENTION

Modes for Carrying Out the Invention

Figure 1:
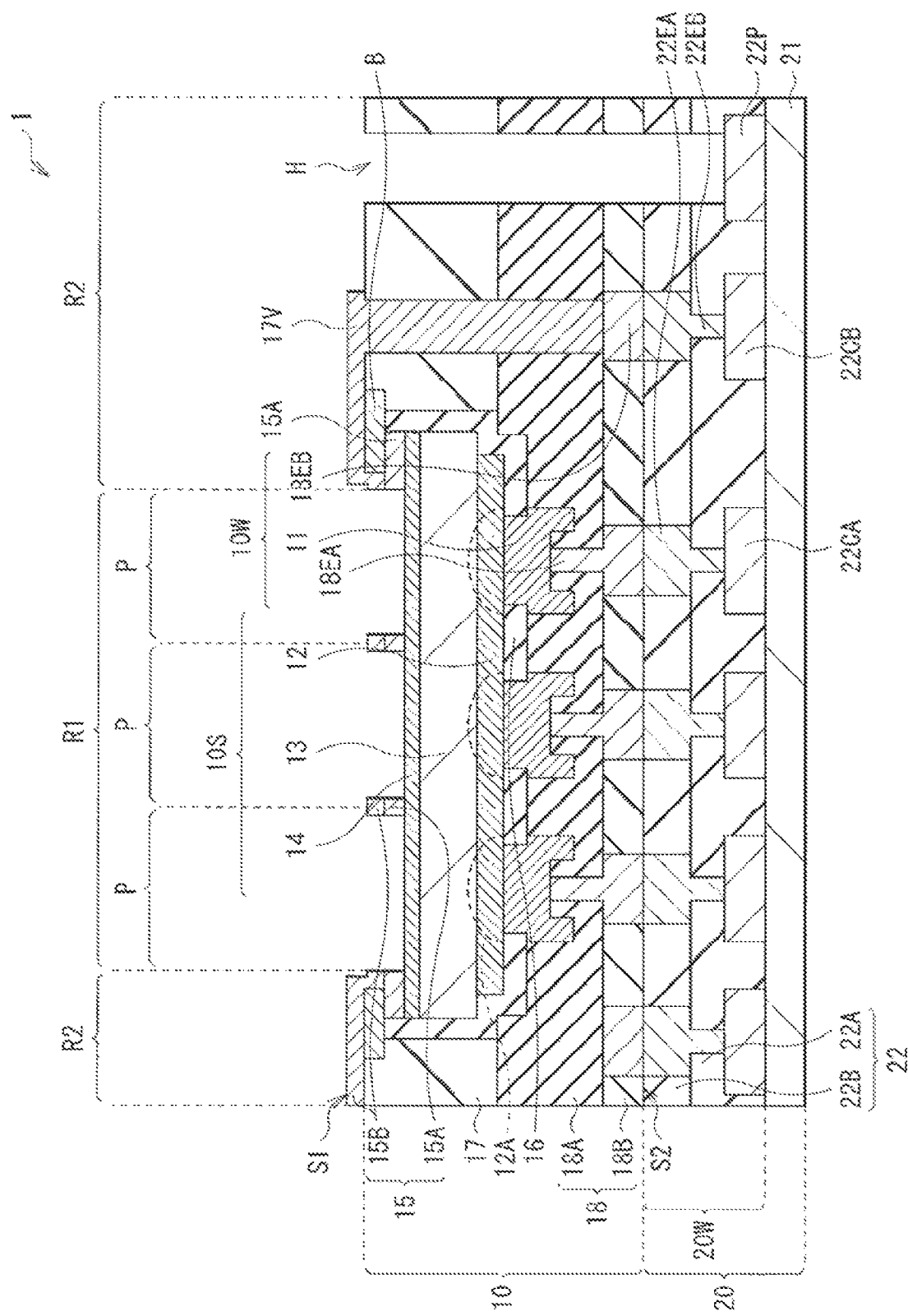
FIG. 1 is a cross-sectional schematic view illustrating a schematic configuration of a light receiving element according to a first embodiment of the present disclosure.

Some embodiments of the present disclosure are described below in detail with reference to the drawings. The following description is a specific example of the present disclosure, and the present disclosure is not limited to the following aspects. In addition, the present disclosure is not limited to the arrangement, dimensions, dimensional ratios, and the like of the constituent elements illustrated in the drawings. It is to be noted that the description is given in the following order.

1. First Embodiment (An example of a light receiving element including an electrode having a light-shielding property between pixels)
    1-1. Configuration of Light Receiving Element
    1-2. Method of Manufacturing Light Receiving Element
    1-3. Operation of Light Receiving Element
    1-4. Workings and Effects
2. Modification Examples
    2-1. Modification Example 1 (An example of including a color filter and on-chip lens)
    2-2. Modification Example 2 (An example of directly providing an electrode having a light-shielding property over a photoelectric converter)
3. Second Embodiment (An example of a light receiving element in which an insulating layer is formed over a photoelectric converter)
    3-1. Configuration of Light Receiving Element
    3-2. Workings and Effects
4. Modification Examples
    4-1. Modification Example 3 (An example of a light receiving element in which a light-shielding film is formed over a first electrode)
    4-2. Modification Example 4 (An example of a light receiving element in which a light-shielding film is formed between an insulating layer and a first electrode)
    4-3. Modification Example 5 (An example of a light receiving element in which a carrier-induction layer is formed over a photoelectric converter)

4-4. Modification Example 6 (An example of a light receiving element which discharges electric charges from side opposite to a light incident surface)

5. Application Examples

FIRST EMBODIMENT

FIG. 1 schematically illustrates a cross-sectional configuration of a light receiving element (light receiving element 1) according to a first embodiment of the present disclosure. The light receiving element 1 is applied to, for example, an infrared sensor or the like using a compound semiconductor material such as a III-V group semiconductor or the like, and has a photoelectric conversion function to light having a wavelength of a visible region (e.g., more than or equal to 380 nm and less than 780 nm) to a short infrared region (e.g., more than or equal to 780 nm and less than 2400 nm), for example. The light receiving element 1 is provided with a plurality of light receiving unit regions (pixels P) that are two-dimensionally disposed, for example. FIG. 1 illustrates a cross-sectional configuration of a portion corresponding to three pixels P.

1-1. Configuration of Light Receiving Element

The light receiving element 1 has a stacked structure of an element substrate 10 and a circuit board 20. One surface of the element substrate 10 is a light incident surface (light incident surface S1), and a surface (another surface) opposite to the light incident surface S1 is a surface (bonding surface S2) bonded to the circuit board 20. The element substrate 10 has a configuration in which interlayer insulating films 18 (18B and 18A), a second contact layer 12, a photoelectric conversion layer 13, a first contact layer 14, and a first electrode 15 are stacked in this order from the circuit board 20 side. In the present embodiment, the second contact layer 12, the photoelectric conversion layer 13, and the first contact layer 14 configures a photoelectric converter 10S common to the plurality of pixels P, and the first electrode 15 having a light-shielding property is provided between pixels P adjacent to each other on the light incident surface S1 side of the photoelectric converter 10S.

As described above, the element substrate 10 includes the interlayer insulating films 18B and 18A, the second contact layer 12, the photoelectric conversion layer 13, the first contact layer 14, and the first electrode 15 in this order from a position close to the circuit board 20. The interlayer insulating films 18 are provided with a wiring layer 10W including a second electrode 11. A surface of the photoelectric converter 10S that opposes the wiring layer 10W and an end surface (side surface) of the photoelectric converter 10S are covered with an insulating film 16. The circuit board 20 includes a wiring layer 20W in contact with the bonding surface S2 of the element substrate 10 and a support base 21 that opposes the element substrate 10 with the wiring layer 20W interposed therebetween.

A pixel region R1, which is a light receiving region, is provided in a center portion of the element substrate 10, and the photoelectric converter 10S is disposed in the pixel region R1. In other words, a region in which the photoelectric converter 10S is provided is the pixel region R1. A peripheral region R2 surrounding the pixel region R1 is provided outside the pixel region R1. The peripheral region R2 of the element substrate 10 is provided with an embedded layer 17 along with the insulating film 16. In the present embodiment, the first electrode 15 is provided between pixels P adjacent to each other as described above, and is formed, for example, in a so-called lattice shape in plan view. Therefore, in the light receiving element 1 of the present embodiment, light enters the photoelectric converter 10S through the first contact layer 14 from the first electrode 15 provided between the pixels P. A signal charge photoelectrically converted by the photoelectric converter 10S travels through the wiring layer 10W and is read out by the circuit board 20. Hereinafter, a configuration of each section will be described.

The wiring layer 10W includes, for example, the second electrode 11 and contact electrodes 18EA and 18EB in the interlayer insulating films 18 (18A and 18B).

The interlayer insulating films 18 (18A and 18B) are provided over the pixel region R1 and the peripheral region R2, and include the bonding surface S2 with the circuit board 20. The bonding surface S2 in the pixel region R1 and the bonding surface in the peripheral region R2 form the same plane. The interlayer insulating films 18A and 18B are in a stacked structure, for example, the interlayer insulating film 18A is disposed on side of the second contact layer 12, and the interlayer insulating film 18B is disposed on the circuit board 20 side. The interlayer insulating films 18A and 18B include an inorganic insulating material, for example. Examples of the inorganic insulating material include silicon nitride (SiN), aluminum oxide (Al2O3), silicon oxide (SiO2), hafnium oxide (HfO2), and the like. The interlayer insulating films 18A and 18B may each be formed using inorganic insulating materials that differ from each other, or may each be formed using the same inorganic insulating material.

The second electrode 11 is an electrode (anode) to which a voltage for reading out a signal charge (a hole or an electron, hereinafter, for convenience, described on the assumption that the signal charge is a hole) generated in the photoelectric conversion layer 13 is supplied, and is provided for each pixel P in the pixel region R1. The second electrode 11 provided in the wiring layer 10W is in contact with the second contact layer 12 of the photoelectric converter 10S via connection holes of the interlayer insulating film 18A and the insulating film 16. Second electrodes 11 adjacent to each other are electrically separated by the interlayer insulating film 18B and the insulating film 16.

The second electrode 11 includes, for example, any one of titanium (Ti), tungsten (W), titanium nitride (TiN), platinum (Pt), gold (Au), germanium (Ge), palladium (Pd), zinc (Zn), nickel (Ni), and aluminum (Al), or an alloy containing at least one of those. The second electrode 11 may be a single film of such materials, or may be a stacked film in which two or more materials are combined. For example, the second electrode 11 is configured as a stacked film of titanium and tungsten.

The contact electrode 18EA electrically couples the second electrode 11 to the circuit board 20, and is provided for each pixel P in the pixel region R1. The contact electrodes 18EA adjacent to each other are electrically separated by the interlayer insulating film 18B.

The contact electrode 18EB electrically couples the first electrode 15 to a wiring line (a wiring line 22CB to be described later) of the circuit board 20, and is disposed in the peripheral region R2. The contact electrode 18EB is formed, for example, by the same process as the contact electrode 18EA. The contact electrodes 18EA and 18EB each include, for example, a copper (Cu) pad, and are exposed to the bonding surface S2.

The photoelectric converter 10S includes, for example, the second contact layer 12, the photoelectric conversion layer 13, and the first contact layer 14, from a position close to the wiring layer 10W. The second contact layer 12, the photoelectric conversion layer 13, and the first contact layer 14 have, for example, substantially the same planar shapes.

The second contact layer 12 is, for example, provided in common to all pixels P, and is disposed between the insulating film 16 and the photoelectric conversion layer 13. The second contact layer 12 electrically separates the pixels P adjacent to each other, and the second contact layer 12 is provided with, for example, a plurality of diffusion regions 12A. It is possible to suppress a dark current by the second contact layer 12 including a compound semiconductor material having a band gap larger than a band gap of the compound semiconductor material included in the photoelectric conversion layer 13. For example, it is possible for the second contact layer 12 to include n-type InP (indium phosphide).

The diffusion regions 12A provided in the second contact layer 12 are spaced apart from each other. The diffusion region 12A is disposed for each pixel P, and the second electrode 11 is coupled to each diffusion region 12A. The diffusion region 12A reads out a signal charge generated in the photoelectric conversion layer 13 for each pixel P, and includes, for example, a p-type impurity. As the p-type impurity, there are given Zn (zinc) and the like. In this manner, a p-n junction interface is formed between the diffusion region 12A and the second contact layer 12 other than the diffusion region 12A, and the pixels P adjacent to each other are electrically isolated. The diffusion region 12A is provided, for example, in a thickness direction of the second contact layer 12, and is also provided in a portion of a thickness direction of the photoelectric conversion layer 13.

The photoelectric conversion layer 13 between the second electrode 11 and the first electrode 15, more specifically, between the second contact layer 12 and the first contact layer 14, is provided in common to all pixels P, for example. The photoelectric conversion layer 13 absorbs light of a predetermined wavelength to generate a signal charge, and includes, for example, a compound semiconductor material such as a III-V group semiconductor of i-type. Examples of the compound semiconductor material included in the photoelectric conversion layer 13 include InGaAs (indium gallium arsenide), InAsSb (indium arsenide antimony), InAs (indium arsenide), InSb (indium antimony), HgCdTe (mercury cadmium tellurium), and the like. The photoelectric conversion layer 13 may include Ge (germanium). In the photoelectric conversion layer 13, photoelectric conversions are performed on light having a wavelength of from a visible region to a short infrared region, for example.

The first contact layer 14 is provided in common to all pixels P, for example. The first contact layer 14 is provided between and in contact with the photoelectric conversion layer 13 and the first electrode 15. The first contact layer 14 is a region through which an electric charge discharged from the first electrode 15 travels, and includes, for example, a compound semiconductor containing an n-type impurity. For example, it is possible for the first contact layer 14 to include n-type InP (indium phosphorus). The first contact layer 14 has the thickness of, for example, more than or equal to 20 nm and less than or equal to 1000 nm.

The first electrode 15 has a structure in which a cap layer 15A and a light-shielding film 15B are stacked in this order, and is provided, for example, in a lattice shape between the pixels P adjacent to each other and provided over the first contact layer 14 (the light incident surface side). The first electrode 15 (cathode) is used to discharge electric charges that are not used as signal charges among the electric charges generated in the photoelectric conversion layer 13. For example, in a case where a hole is read out from the second electrode 11 as a signal charge, the electron is discharged through the first electrode 15. As described above, by providing first electrode 15 in the lattice shape, the resistance of the extraction of electrons is reduced, the demand for reducing the resistance to the first contact layer 14 is reduced, and this makes it possible to reduce the thickness of the first contact layer 14.

The cap layer 15A includes a semiconductor material that is able to epitaxially grow on the first contact layer 14 of the photoelectric converter 10S, and may include, for example, InGaAs, InAsSb, or the like.

The light-shielding film 15B extends from the pixel region R1 to the peripheral region R2, and is provided over the cap layer 15A in the pixel region R1. That is, the light-shielding film 15B is provided, for example, in a lattice shape between the pixels P adjacent to each other in the pixel region R1. The light-shielding film 15B includes a metal film having a light-shielding property. Specifically, it is possible to use a tungsten (W) film, a copper (Cu) film, an aluminum (Al) film, a silver (Ag) film, or the like. The metal film is stacked over the cap layer 15A via a barrier metal film such as a titanium (Ti) film, a titanium nitride (TiN) film, or the like. That is, the light-shielding film 15B has a stacked structure in which the barrier metal film and the metal film are stacked in order from the cap layer 15A side. As a result, an ohmic contact is formed between the cap layer 15A and the light-shielding film 15B. The thickness of the light-shielding film 15B is, for example, preferably more than or equal to 50 nm and less than or equal to 1000 nm, and of these, the thickness of the barrier metal film is, for example, more than or equal to 10 nm and less than or equal to 500 nm, and the thickness of the metal film is, for example, more than or equal to 50 nm and less than or equal to 1000 nm.

Figure 2:
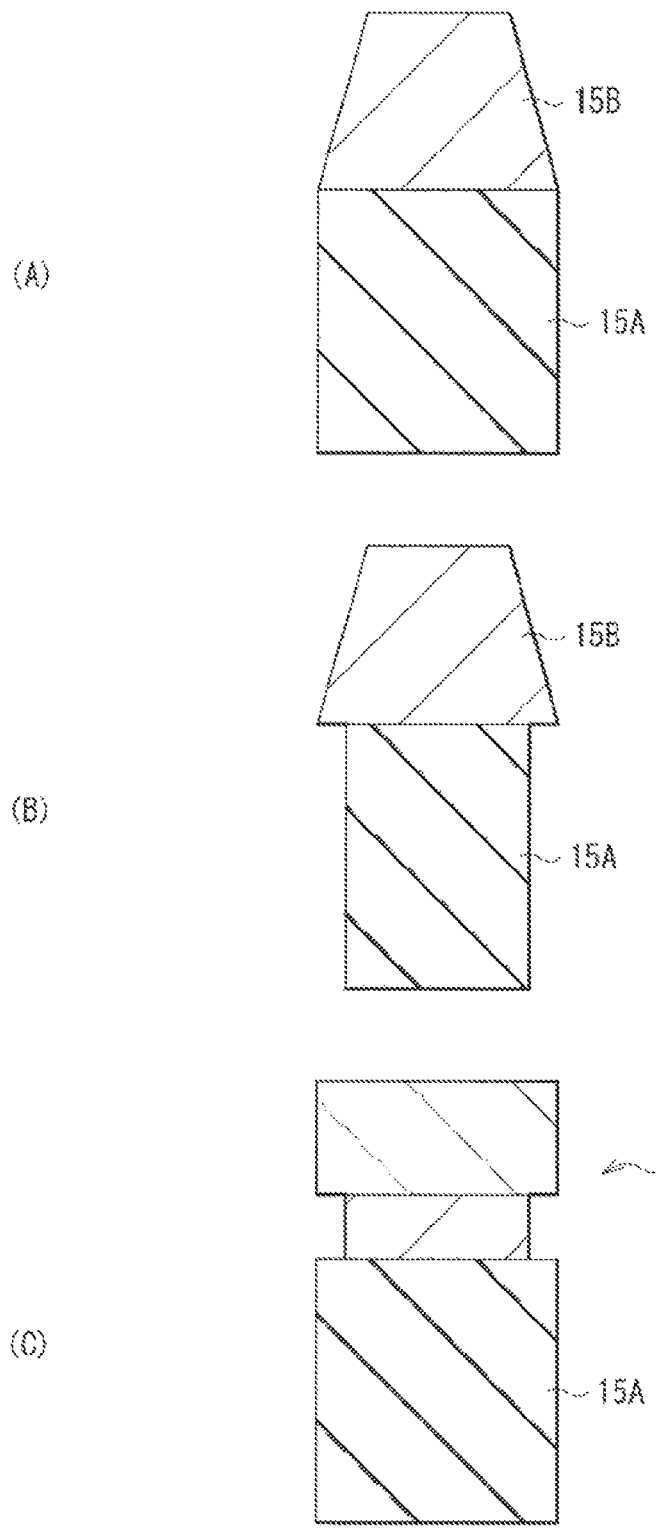
FIG. 2 includes schematic views each illustrating a cross-sectional shape of an electrode on light incident surface side of the light receiving element illustrated in FIG. 1.

In FIG. 1, the cross-sectional shape of the first electrode 15 is a rectangular shape in which the cap layer 15A and the light-shielding film 15B has a continuous common side, but is not limited thereto. For example, as illustrated in FIG. 2(A), slopes may be formed on side surfaces of the light-shielding film 15B, or as illustrated in FIG. 2(B), side surfaces of the light-shielding film 15B may have slopes and the cap layer 15A may be etched inward of the bottom surface of the light-shielding film 15B. Further, as illustrated in FIG. 2(C), the cap layer 15A and the metal film portion may have the same side surface, and only the barrier metal film between the cap layer 15A and the metal film may be etched inward.

The first electrode 15 is formed, although the detail thereof is described later, for example, by patterning the light-shielding film 15B by dry etching and then patterning the cap layer 15A by wet etching using the light-shielding film 15B as a metal mask. In a case where the cap layer 15A is patterned by wet etching as described above, the cross-sectional shape of the cap layer 15A (for example, N+InGaAs layer) patterned in a lattice shape has different characteristics depending on crystallographic plane orientations. Generally, an InGaAs/InP crystal in a 100 plane is processed to have an inverse taper in a (011) plane cross-sectional direction and a forward taper in the direction rotated by 90 degrees with respect to a (011) plane.

Although not illustrated, a passivation film is provided over the surface of the light receiving element 1. The passivation film may have an anti-reflection function. Examples of the passivation film may include silicon nitride (SiN), aluminum oxide ($Al_2O_3$), silicon oxide ($SiO_2$), tantalum oxide ($Ta_2O_3$), and the like.

The insulating film 16 is provided between the second contact layer 12 and the wiring layer 10W, covers a bottom surface and an end surface of the second contact layer 12, an end surface of the photoelectric conversion layer 13, an end surface of the first contact layer 14, and an end surface of the cap layer 15A, and is in contact with the light-shielding film 15B in the peripheral region R2. The insulating film 16 includes, for example, an oxide such as silicon oxide (SiOX), aluminum oxide (Al2O3), or the like. The insulating film 16 may be configured as a stacked structure including a plurality of films. The insulating film 16 may include a silicon (Si)-based insulating material such as silicon oxynitride (SiON), carbon-containing silicon oxide (SiOC), silicon nitride (SiN), silicon carbide (SiC), or the like, for example.

The embedded layer 17 fills a step between a temporary substrate (a temporary substrate 73 in FIG. 3B to be described later) and the photoelectric converter 10S in a manufacturing process of the light receiving element 1. As will be described later in detail, in the present embodiment, since the embedded layer 17 is formed, it is possible to suppress generation of a defect in the manufacturing process caused by the step between the photoelectric converter 10S and the temporary substrate 73.

The embedded layer 17 is provided between the wiring layer 10W and the light-shielding film 15B, and has a thickness more than or equal to the thickness of the photoelectric converter 10S, for example. Here, since the embedded layer 17 is provided so as to surround the photoelectric converter 10S, a region (peripheral region R2) is formed around the photoelectric converter 10S. Thus, it is possible to provide the bonding surface S2 with the circuit board 20 in the peripheral region R2. If the bonding surface S2 is formed in the peripheral region R2, the thickness of the embedded layer 17 may be reduced; however, it is preferable that the embedded layer 17 cover the photoelectric converter 10S over the thickness direction, and that the embedded layer 17 cover the entire surface of the end surface of the photoelectric converter 10S. By covering the entire end surface of the photoelectric converter 10S with the embedded layer 17 via the insulating film 16, it is possible to effectively suppress ingress of water into the photoelectric converter 10S.

A surface of the embedded layer 17 on the bonding surface S2 side is flattened, and is provided with the wiring layer 10W on the flattened surface of the embedded layer 17 in the peripheral region R2. For the embedded layer 17, for example, it is possible to use an inorganic insulating material such as silicon oxide (SiOX), silicon nitride (SiN), silicon oxynitride (SiON), carbon-containing silicon oxide (SiOC), silicon carbide (SiC), or the like.

The embedded layer 17 is provided with a penetration electrode 17V. The penetration electrode 17V couples the first electrode 15 and the wiring layer 20W provided in the circuit board 20. One side of the penetration electrode 17V is coupled to the first electrode 15, and another side of the penetration electrode 17V passes through the interlayer insulating film 18A and is coupled to the contact electrode 18EB. The contact electrode 18EB is provided in the peripheral region R2 in the interlayer insulating film 18B, and is electrically coupled to the wiring line 22CB provided in the peripheral region R2 in the wiring layer 20W.

The support base 21 supports the wiring layer 20W and includes, for example, silicon (Si). The wiring layer 20W includes, for example, contact electrodes 22EA and 22EB, a pixel circuit 22CA, the wiring line 22CB, and a pad electrode 22P, in interlayer insulating films 22 (22A and 22B).

The interlayer insulating films 22A and 22B each include an inorganic insulating material, for example. Examples of the inorganic insulating material include silicon nitride (SiN), aluminum oxide (Al2O3), silicon oxide (SiO2), hafnium oxide (HfO2), and the like. The interlayer insulating films 22A and the 22B may be formed using different inorganic insulating materials from each other, or may be formed using the same inorganic insulating material.

The contact electrode 22EA is provided, for example, in the pixel region R1, electrically couples the second electrode 11 and the pixel circuit 22CA, and is in contact with the contact electrode 18EA at the bonding surface S2 of the element substrate 10. Contact electrodes 22EA adjacent to each other are electrically separated by the interlayer insulating films 22A and 22B.

The contact electrode 22EB is provided, for example, in the peripheral region R2, electrically couples the first electrode 15 and the wiring line 22CB of the circuit board 20, and is in contact with the contact electrode 18EB at the bonding surface S2 of the element substrate 10. The contact electrode 22EB is formed by the same process as the contact electrode 22EA, for example. The penetration electrode 17V may be coupled to the wiring line 22CB without providing the contact electrodes 18EB and 22EB.

The contact electrodes 22EA and 22EB each include, for example, a copper (Cu) pad, and are exposed on a surface, of the circuit board 20, opposing the element substrate 10. That is, a Cu—Cu bonding is formed each of between the contact electrode 18EA and the contact electrode 22EA and between the contact electrode 18EB and the contact electrode 22EB.

The pixel circuit 22CA is provided for each pixel P in the pixel region R1, for example, and is coupled to the contact electrode 22EA. The pixel circuit 22CA includes a ROIC. The wiring line 22CB is provided in, for example, the peripheral region R2, is coupled to the contact electrode 22EB, and is coupled to, for example, a predetermined electric potential. Accordingly, one type of the charges (e.g., holes) generated in the photoelectric conversion layer 13 is read out from the second electrode 11 to the pixel circuit 22CA via the contact electrodes 18EA and 22EA, and the other type of the charges (e.g., electrons) generated in the photoelectric conversion layer 13 is discharged from the first electrode 15 to the predetermined electric potential via the penetration electrode 17V and the contact electrodes 18EB and 22EB.

The pad electrode 22P electrically couples to the outside. The light receiving element 1 is provided with an opening H which penetrates the element substrate 10 and reaches the pad electrode 22P, and is electrically coupled to the outside via the opening H. The coupling is achieved by, for example, wire bonding or bumping.

1-2. Method of Manufacturing Light Receiving Element

It is possible to manufacture the light receiving element 1 as follows, for example. FIGS. 3A to 8C illustrate processes of manufacturing the light receiving element 1 in process order.

Figure 3A:
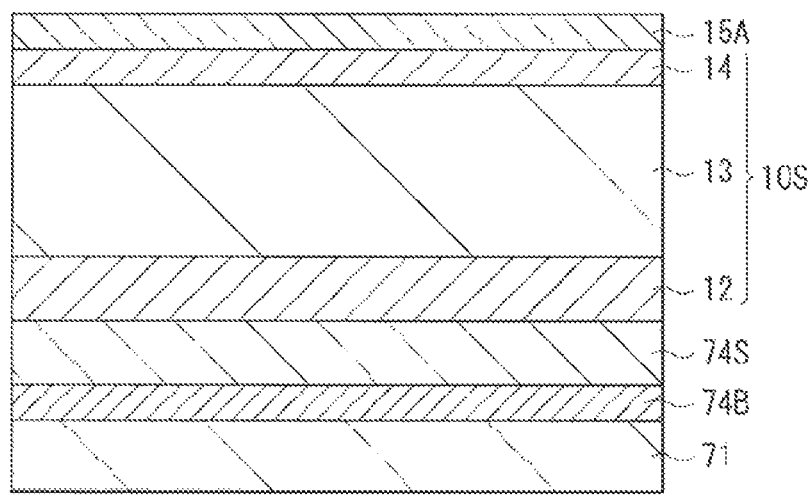
FIG. 3A is a cross-sectional schematic view for describing one process of a method of manufacturing the light receiving element illustrated in FIG. 1.

First, as illustrated in FIG. 3A, on a growth substrate 71, for example, a buffer layer 74B including n-type InP, a stopper layer 74S including i-type InGaAs, the photoelectric converter 10S, and the cap layer 15A including i-type InGaAs are formed in this order by epitaxial growth. The diameter of the growth substrate 71 is, for example, less than or equal to 6 inches. As the photoelectric converter 10S, for example, the second contact layer 12 including n-type InP, the photoelectric conversion layer 13 including i-type or n-type InGaAs, and the first contact layer 14 including n-type InP are formed in this order.

Figure 3B:
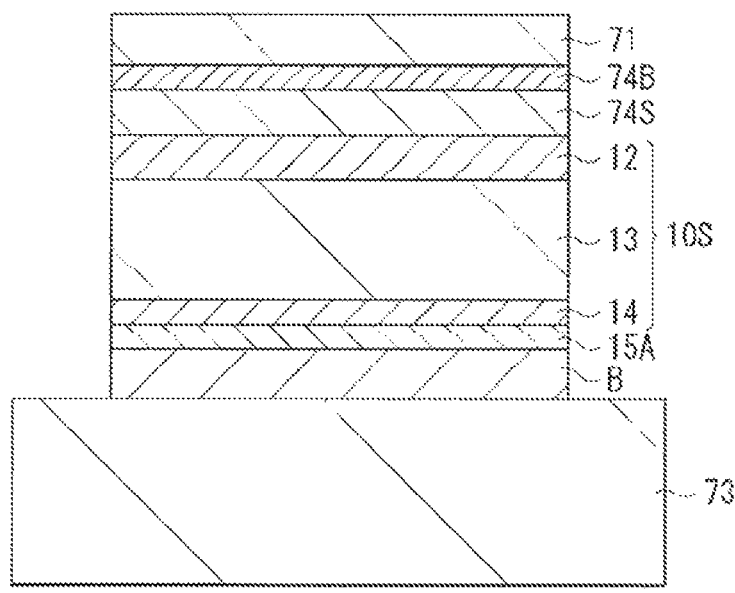
FIG. 3B is a cross-sectional schematic view illustrating a process following FIG. 3A.

Subsequently, as illustrated in FIG. 3B, the growth substrate 71 is bonded to the temporary substrate 73 having a large diameter with an adhesion layer B therebetween. At this time, the cap layer 15A is interposed between the adhesion layer B and the first contact layer 14. For example, a silicon (Si) substrate having a larger diameter than the growth substrate 71 is used for the temporary substrate 73. The diameter of the temporary substrate 73 is, for example, 8 inches to 12 inches. By bonding the growth substrate 71 having a small diameter to the temporary substrate 73 having a large diameter, it becomes possible to use various devices to be used for substrates having large diameters when forming element substrate 10. As a result, for example, it is possible to form the bonding between the circuit board 20 and the element substrate 10 into a Cu—Cu bonding, and to miniaturize the pixel P. The bonding of the growth substrate 71 to the temporary substrate 73 may be performed by plasma-activated bonding, room-temperature bonding, bonding using an adhesive (adhesive bonding), or the like. Thus, for example, the photoelectric converter 10S of a wafer shape is bonded to the temporary substrate 73. The photoelectric converter 10S is not limited to the wafer shape, and may be fragmented into chips.

After the growth substrate 71 on which the photoelectric converter 10S is formed is bonded to the temporary substrate 73, the growth substrate 71 is removed as illustrated in the drawing 4A. It is possible to remove the growth substrate 71 by mechanical grinding, CMP (Chemical Mechanical Polishing), wet etching, dry etching, or the like.

Figure 4A:
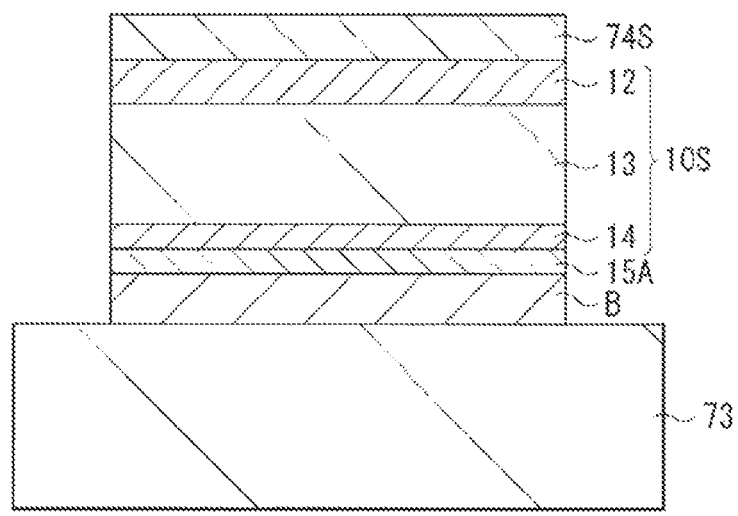
FIG. 4A is a cross-sectional schematic view illustrating a process following FIG. 3B.
Figure 4B:
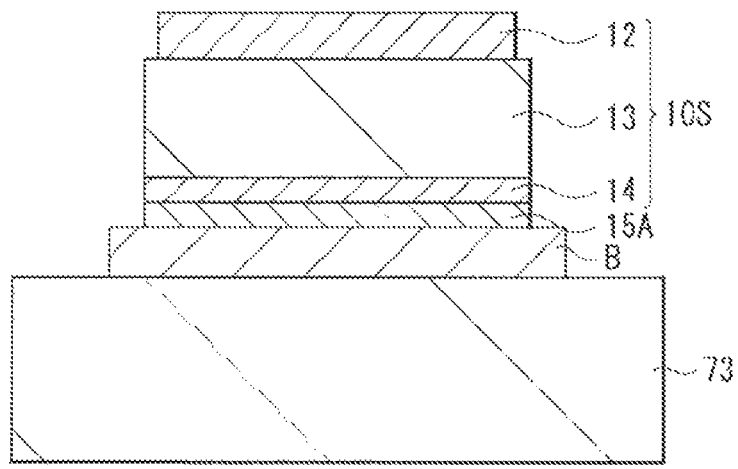
FIG. 4B is a cross-sectional schematic view illustrating a process following FIG. 4A.

Subsequently, as illustrated in FIG. 4B, positional deviation of the photoelectric converter 10S with respect to the temporary substrate 73 is corrected. Specifically, for example, photolithography and etching are used to correct the positional deviation of the photoelectric converter 10S. A resist (resist PR) is formed over the photoelectric converter 10S, and the photoelectric converter 10S is etched as appropriate. As the etching, dry etching, wet etching, or the like may be used. This removes unwanted portions of the photoelectric converter 10S and leaves the photoelectric converter 10S only in a defined region (pixel region R1) of the temporary substrate 73. As described above, the positional deviation of the photoelectric converter 10S with respect to the temporary substrate 73 is corrected, and thus, it is possible to suppress the generation of the misalignment in the later process, and to easily form the light receiving element 1 having a desired configuration.

Figure 5A:
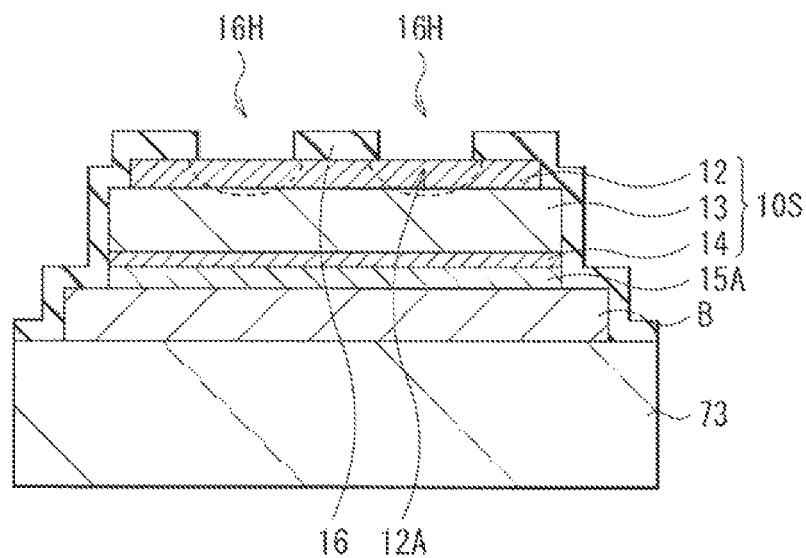
FIG. 5A is a cross-sectional schematic view illustrating a process following FIG. 4B.

After the positional deviation of the photoelectric converter 10S with respect to temporary substrate 73 is corrected, as illustrated in FIG. 5A, the insulating film 16 film is formed over the entire surface of the temporary substrate 73. Subsequently, the diffusion region 12A is formed for each pixel P in the photoelectric converter 10S. As a result, element isolation is performed. For forming the diffusion region 12A, for example, the insulating film 16 is used as a hard mask. Specifically, after a mask of a predetermined shape is formed on the second contact layer 12, an opening 16H is formed on the insulating film 16 by etching. Thereafter, the resist is stripped, and vapor-phase diffusion of a p-type impurity is performed using the insulating film 16 as a hard mask. As a result, the diffusion region 12A is formed in the selective region. The diffusion region 12A may be formed by ion implantation or the like using a resist mask. Here, the diffusion region 12A is formed in the photoelectric converter 10S provided over the temporary substrate 73 having a large diameter; therefore, it is possible to miniaturize the pixel P.

Figure 5B:
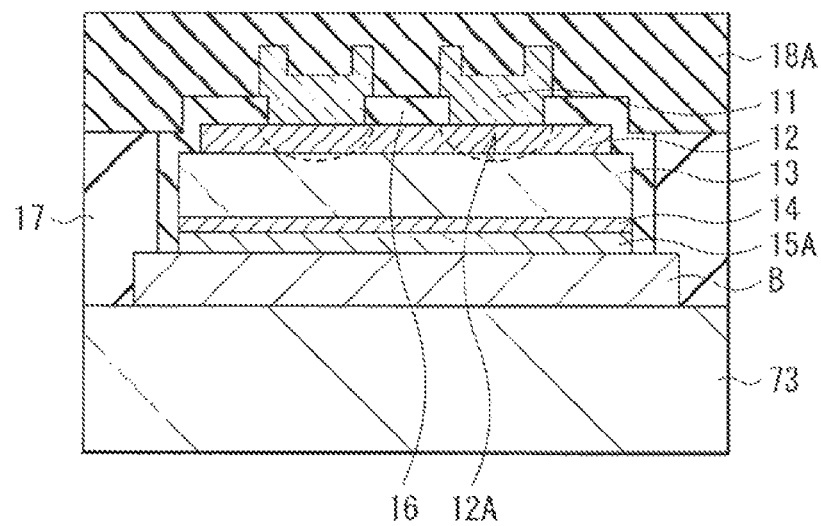
FIG. 5B is a cross-sectional schematic view illustrating a process following FIG. 5A.

After forming the diffusion region 12A over the photoelectric converter 10S, as illustrated in FIG. 5B, an insulating material film is formed over the entire surface of the temporary substrate 73, and then is flattened by, for example, CMP. Thus, the embedded layer 17 is formed in the peripheral region R2 of the photoelectric converter 10S, the embedded layer 17 having the same plane as the top surface (the plane furthest from the temporary substrate 73) of the photoelectric converter 10S. It is to be noted that the diffusion region 12A and the embedded layer 17 may be formed in the reverse order, or the diffusion region 12A and the embedded layer 17 may be formed in this order after the positional deviation of the photoelectric converter 10S with respect to the temporary substrate 73 is corrected.

Subsequently, the wiring layer 10W including the second electrode 11 is formed over the photoelectric converter 10S. First, an insulating material film is formed over the entire surface of the photoelectric converter 10S and the embedded layer 17, and then an opening is formed. The opening is subjected to a CVD (Chemical Vapor Deposition) method, a PVD (Physical Vapor Deposition) method, an ALD (Atomic Layer Deposition) method, an evaporation method, or the like, to thereby form, for example, a stacked film of titanium (Ti)/tungsten (W), and thereafter, the stacked film is patterned by photolithography and etching. Thus, the second electrode 11 is formed. Thereafter, an insulating material film is further formed so as to cover the second electrode 11, and then flattened by, for example, CMP, to form the interlayer insulating film 18A.

Figure 6A:
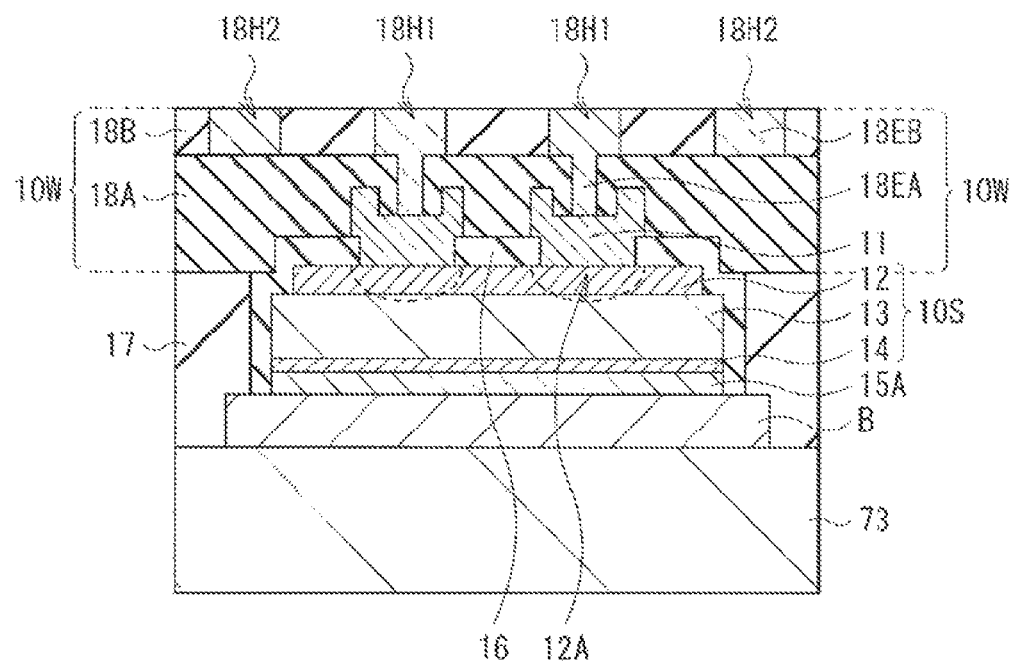
FIG. 6A is a cross-sectional schematic view illustrating a process following FIG. 5B.

Next, an insulating material film is formed over the interlayer insulating film 18A, and is flattened by, for example, CMP; thus, the interlayer insulating film 18B is formed. Thereafter, as illustrated in FIG. 6A, an opening 18H1 and an opening 18H2 are formed over the photoelectric converter 10S (pixel region R1) and the region (peripheral region R2) other than photoelectric converter 10S, respectively. It is to be noted that, in the opening 18H1 formed over the photoelectric converter 10S, a portion of the second electrode 11 is exposed to the bottom surface of the opening 18H1. A copper (Cu) film is formed on each of the openings 18H1 and 18H2 of the interlayer insulating film 18B by vapor deposition, PVD, plating, or the like, and then the surface of the copper film is polished by, for example, CMP, to thereby form the contact electrodes 18EA and 18EB. As a result, the wiring layer 10W including the second electrode 11, and the contact electrodes 18EA and 18EB is formed. Here, the wiring layer 10W is formed on the temporary substrate 73 having a large diameter; therefore, it becomes possible to use various devices to be used for substrates having large diameters. In addition, since the cap layer 15A is interposed between the adhesion layer B and the first contact layer 14 in the processes of removing the growth substrate 71, forming the diffusion region 12A, forming the wiring layer 10W, and the like, it is possible to suppress the decrease in characteristics of the photoelectric converter 10S, the peeling off of films, and the like.

Figure 6B:
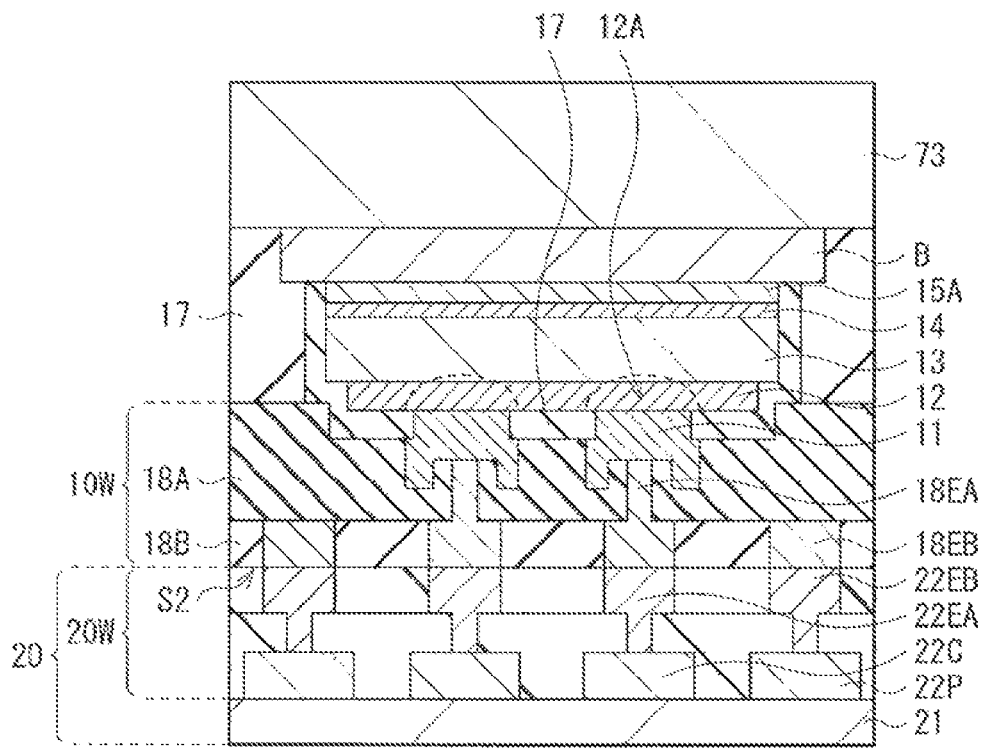
FIG. 6B is a cross-sectional schematic view illustrating a process following FIG. 6A.

After the wiring layer 10W is formed, as illustrated in FIG. 6B, the circuit board 20 is bonded to the temporary substrate 73 with the wiring layer 10W interposed therebetween. At this time, the wiring layer 20W is formed in advance on the circuit board 20. The wiring layer 20W of the circuit board 20 includes the contact electrodes 22EA and 22EB each having a pad structure, and when the circuit board 20 is bonded to the temporary substrate 73, for example, the contact electrodes 22EA and 22EB of the wiring layer 20W and the contact electrodes 18EA and 18EB of the wiring layer 10W are bonded, respectively, by Cu—Cu bonding. More specifically, in the pixel region R1, the bonding surface S2 in which the contact electrode 18EA and the contact electrode 22EA are bonded is formed, and in the peripheral region R2, the bonding surface S2 in which the contact electrode 18EB and the contact electrode 22EB are bonded is formed. Here, the peripheral region R2 of the element substrate 10 is also bonded to the circuit board 20.

Figure 7A:
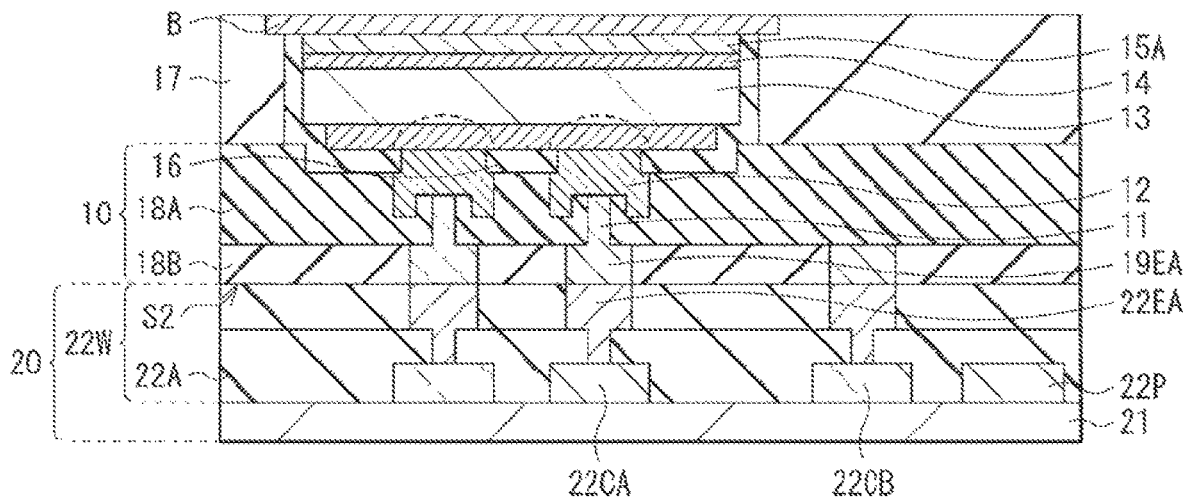
FIG. 7A is a cross-sectional schematic view illustrating a process following FIG. 6B.

Hereinafter, description will be made with reference to the drawings corresponding to the cross-sectional configuration of the light receiving element 1 illustrated in FIG. 1 will be described. After attaching the circuit board 20 to the temporary substrate 73, the temporary substrate 73 is removed as illustrated in FIG. 7A. It is possible to remove the temporary substrate 73 by, for example, mechanical grinding, wet etching, dry etching, or the like.

Figure 7B:
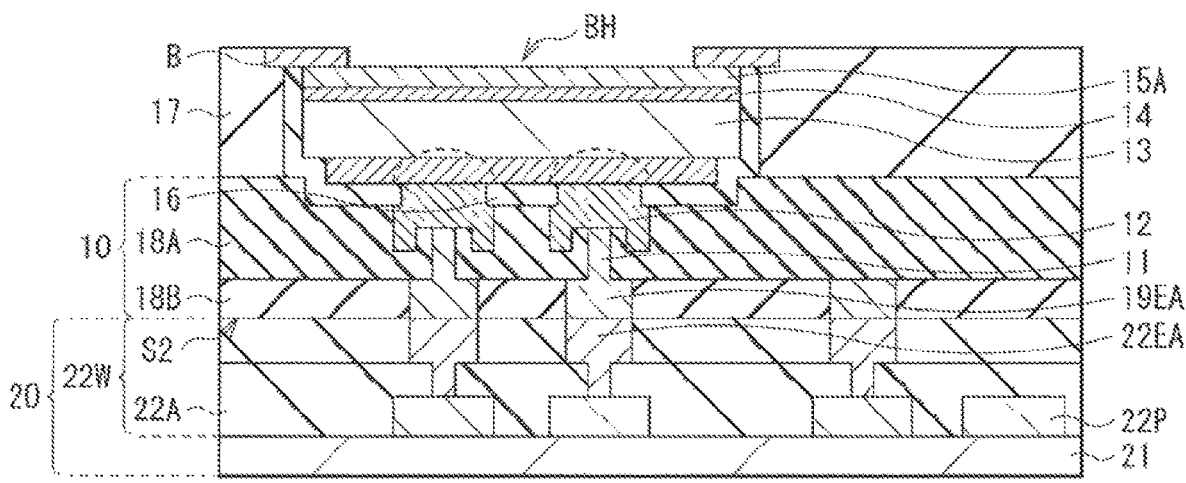
FIG. 7B is a cross-sectional schematic view illustrating a process following FIG. 7A.
Figure 7C:
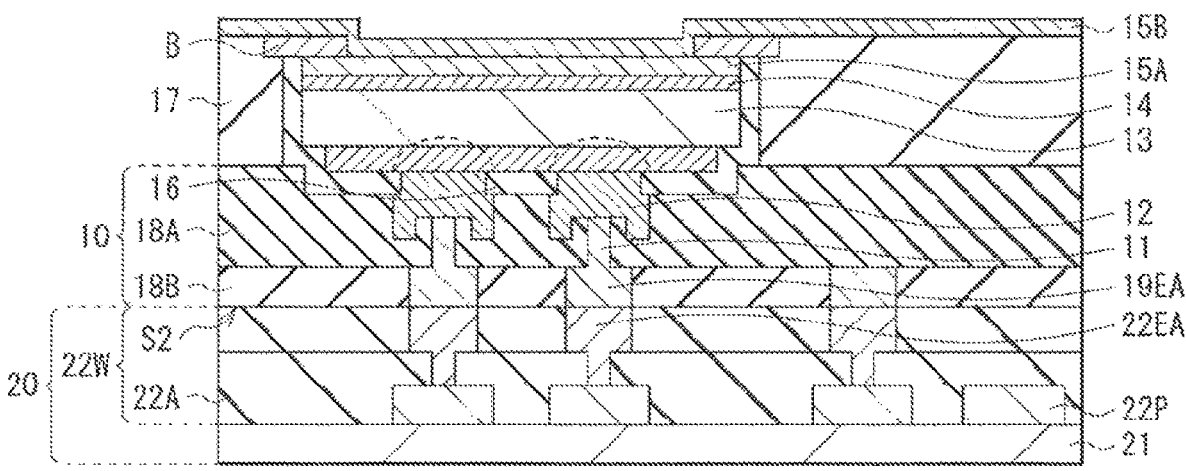
FIG. 7C is a cross-sectional schematic view illustrating a process following FIG. 7B.

Subsequently, as illustrated in FIG. 7B, the adhesion layer B in the pixel region R1 is removed by, for example, wet etching, to thereby provide an opening BH. For the wet etching performed on the adhesion layer B, for example, it is possible to use HF (Hydrogen Fluoride), BHF (Buffered Hydrogen Fluoride), or the like. Next, as illustrated in FIG. 7C, the light-shielding film 15B is formed over the entire surface of the embedded layer 17, the adhesion layer B, and the cap layer 15A by a sputtering method or a CVD method.

Figure 8A:
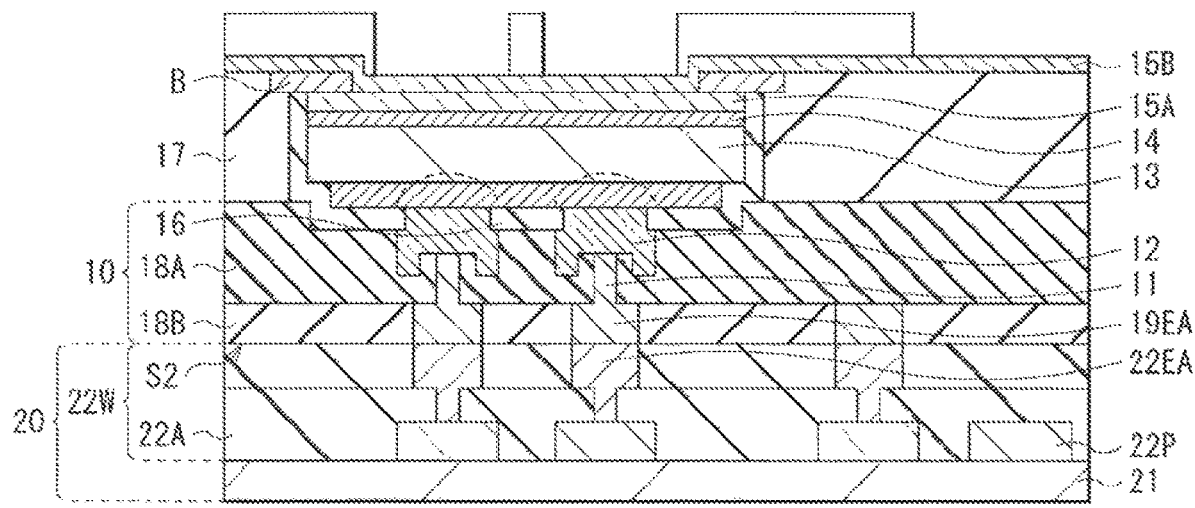
FIG. 8A is a cross-sectional schematic view illustrating a process following FIG. 7C.
Figure 8B:
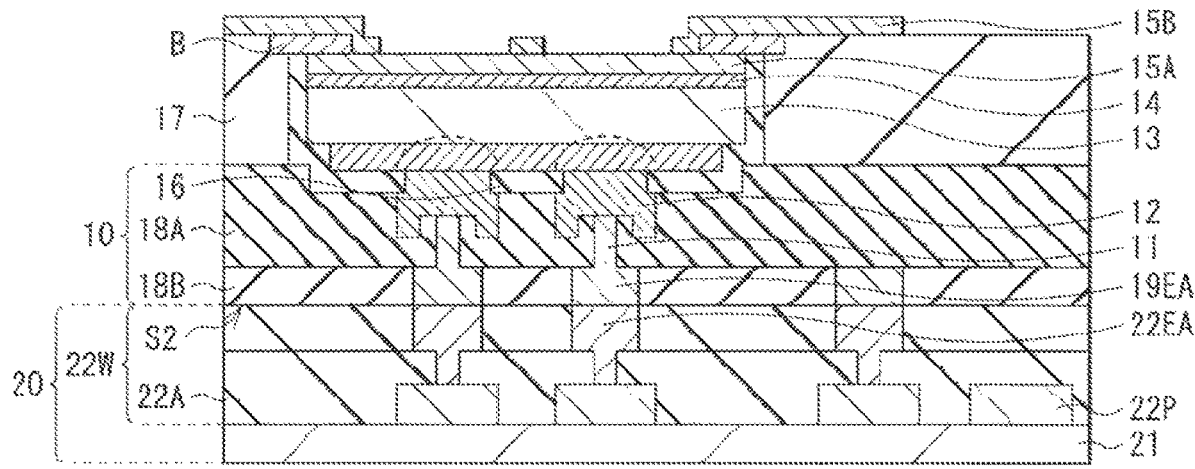
FIG. 8B is a cross-sectional schematic view illustrating a process following FIG. 8A.
Figure 8C:
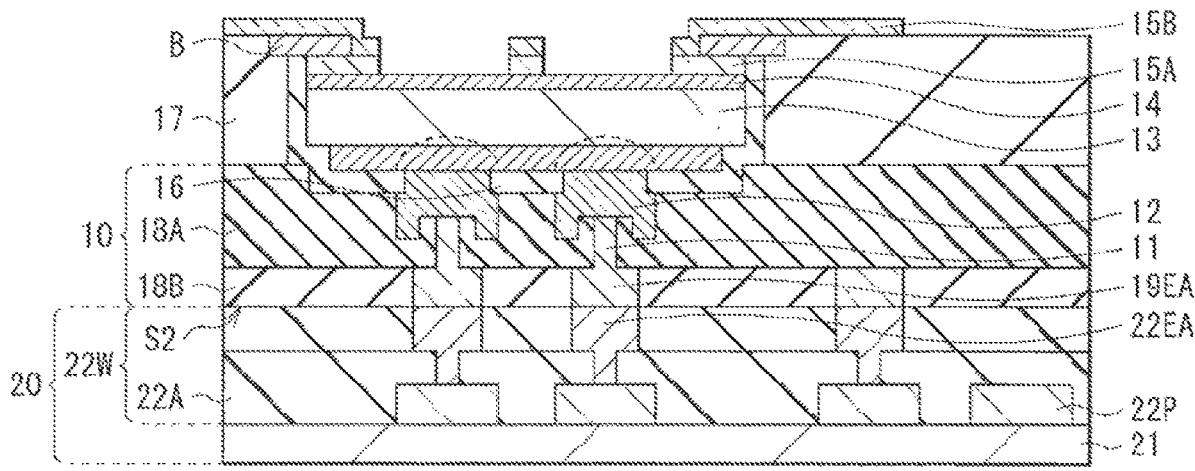
FIG. 8C is a cross-sectional schematic view illustrating a process following FIG. 8B.

Subsequently, as illustrated in FIG. 8A, masks of predetermined shapes are formed on the light-shielding film 15B. Next, as illustrated in FIG. 8B, the light-shielding film 15B is patterned into a lattice shape by dry etching. At this time, ion damage and optical damage due to the dry etching are absorbed by the cap layer 15A, and damage to the first contact layer 14 is reduced. Subsequently, as illustrated in FIG. 8C, the cap layer 15A is patterned by wet etching using the light-shielding film 15B patterned in the lattice shape as a mask.

Finally, over the first contact layer 14, the first electrode 15, and the embedded layer 17, which are exposed by removing the cap layer 15A, the passivation film (not illustrated) is formed, and thereafter, the penetration electrode 17V is formed through the embedded layer 17 to electrically couples the first electrode 15 and the circuit board 20. Subsequently, the opening H is formed which penetrates the element substrate 10 and reaches the pad electrode 22P of the circuit board 20. Thus, the light receiving element 1 illustrated in FIG. 1 is completed.

1-3. Operation of Light Receiving Element

In the light receiving element 1, when light (e.g. light having a wavelength of the visible region and the infrared region) enters the photoelectric conversion layer 13 via a passivation film 19, the first electrode 15, and the first contact layer 14, the light is absorbed in the photoelectric conversion layer 13. As a result, pairs of holes and electrons are generated (photoelectrically converted) in the photoelectric conversion layer 13. At this time, for example, when a predetermined voltage is applied to the second electrode 11, an electric potential gradient is generated in the photoelectric conversion layer 13, and one type of the generated charges (e.g., holes) travels to the diffusion region 12A as a signal charge, and is collected from the diffusion region 12A to the second electrode 11. The signal charge travels to the pixel circuit 22CA via the contact electrodes 18EA and 22EA, and is read out for each pixel P.

1-4. Workings and Effects

As described above, in an image sensor including s semiconductor element (light receiving element) in which a photoelectric conversion layer is formed using a compound semiconductor, leakage of light from an adjacent pixel region occurs and color mixture occurs in a case where a light-shielding film is not disposed between pixels, similarly to a case of a light receiving element in which Si is used.

Incidentally, in an infrared sensor, an improvement in sensitivity is demanded. A light receiving element included in the infrared sensor is generally provided with a transparent electrode on light incident surface side, and the transparent electrode is responsible for reading out electric charges (holes or electrons) generated by photoelectric conversion. In addition, as described above, in the light receiving element in which the compound semiconductor is used for the photoelectric conversion layer, the transparent electrode may not necessarily be included, but in this case, it is necessary to increase the thickness of the compound semiconductor layer (e.g., n+InP layer) in order to reduce the wiring resistance for reading out electric charges. However, the n+InP layer has a high visible-light absorbance, and there is an issue that the n+InP layer lowers sensitivity of the visible region.

In contrast, in the present embodiment, the first electrode 15 having a light-shielding property is provided between the pixels P adjacent to each other and provided on the light incident surface S1 side. In this manner, by forming the first electrode 15 between the pixels P adjacent to each other, leakage of light from the adjacent pixel region is reduced. The first electrode 15 has a stacked structure of the cap layer 15A and the light-shielding film 15B formed using, for example, a metal film. In this manner, with the structure in which the cap layer 15A and the light-shielding film 15B are stacked in this order, it is possible to prevent damage to the photoelectric converter 10S (specifically, the first contact layer 14) at the time of patterning the metal film included in the light-shielding film 15B. Further, by using the cap layer 15A as the first electrode 15, it is possible to reduce the contact resistance between the photoelectric converter 10S (specifically, the first contact layer 14) and the first electrode 15. Still further, by forming the first electrode 15 in, for example, a lattice shape, the wiring resistance of the first electrode 15 that discharges electrons is reduced, for example. As a result, it becomes unnecessary to form a transparent electrode on the light incident surface S1 side, it becomes unnecessary to increase the thickness of the first contact layer 14 included in the photoelectric converter 10S, and it is possible to reduce the absorbance of the visible light by the first contact layer 14.

As described above, in the light receiving element 1 of the present embodiment, the first electrode 15 in which the cap layer 15A and the light-shielding film 15B are stacked in a lattice shape, for example, is provided between the pixels P adjacent to each other and provided on the light incident surface S1 side; therefore, it is not necessary to form a transparent electrode or to increase the thickness of the first contact layer 14. In addition, it is possible to reduce damage to the photoelectric converter (specifically, the first contact layer 14) at the time of patterning the light-shielding film 15B. Therefore, it is possible to improve the sensitivity.

Further, in the present embodiment, the light-shielding film 15B has a stacked structure in which the barrier metal and the metal film are stacked in this order on the cap layer 15A. As a result, the ohmic contact is formed between the cap layer 15A and the light-shielding film 15B. Therefore, it is possible to further reduce the contact resistance between the photoelectric converter 10S (specifically, the first contact layer 14) and the first electrode 15, and to further improve the sensitivity.

Moreover, in the present embodiment, the cap layer 15A is patterned by wet etching; therefore, it is possible to reduce damage to the first contact layer 14. Accordingly, it is possible to reduce the generation of the dark current.

Next, a second embodiment and modification examples 1 to 6 will be described. Hereinafter, the similar components to those of the embodiment described above are denoted by the same reference numerals, and description thereof is omitted as appropriate.

2. MODIFICATION EXAMPLES

2-1. Modification Example 1

Figure 9:
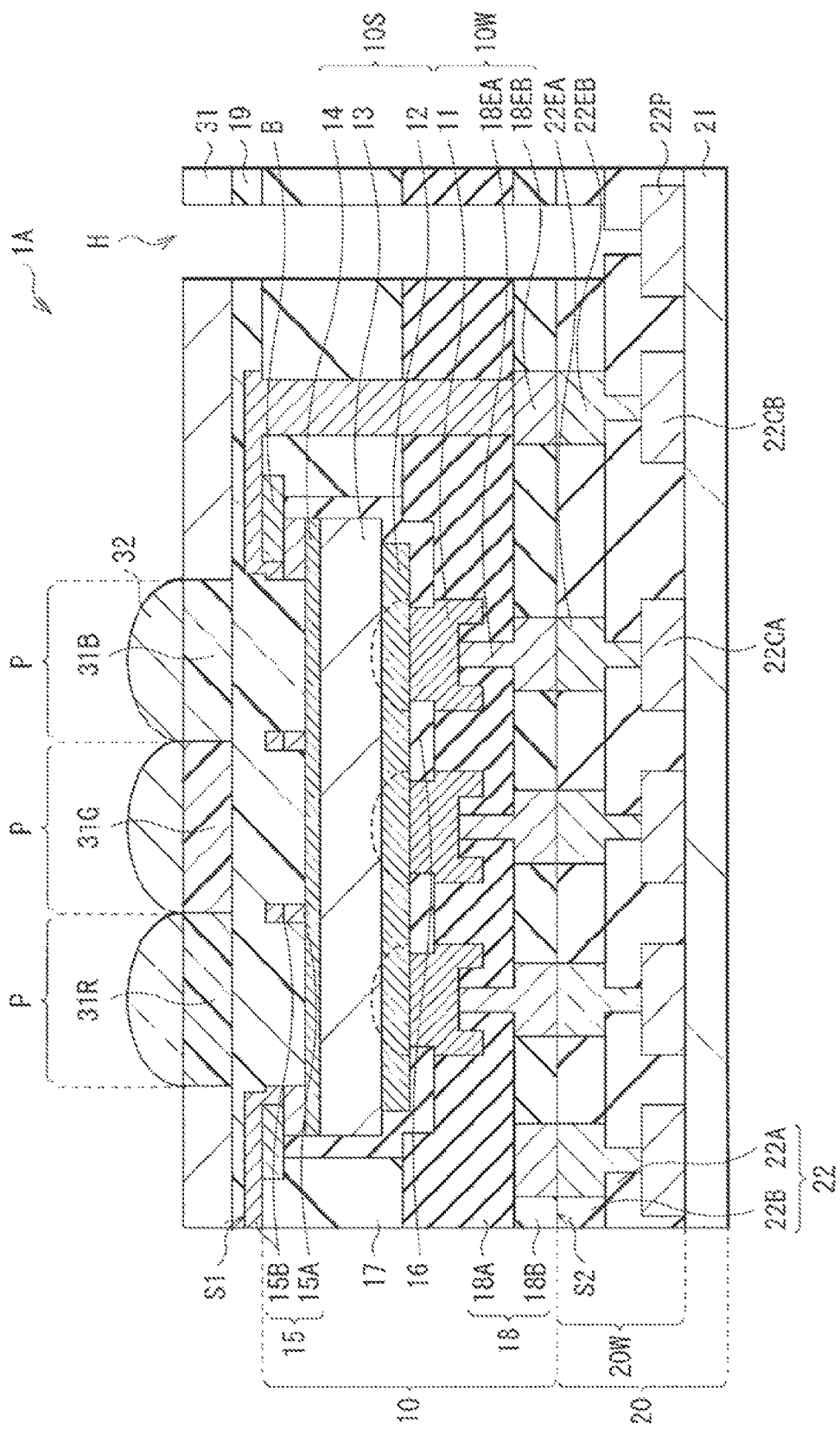
FIG. 9 is a cross-sectional schematic view illustrating a schematic configuration of a light receiving element according to a modification example 1.

FIG. 9 schematically illustrates a cross-sectional configuration of a light receiving element (light receiving element 1A) according to a present modification example (modification example 1) of the present disclosure. The light receiving element 1A is applied to, for example, similarly to the light receiving element 1 in the above embodiment, an infrared sensor or the like using a compound semiconductor material such as a III-V group semiconductor or the like, and has a photoelectric conversion function to light having a wavelength of a visible region (e.g., more than or equal to 380 nm and less than 780 nm) to a short infrared region (e.g., more than or equal to 780 nm and less than 2400 nm), for example. The light receiving element 1 is provided with a plurality of light receiving unit regions (pixels P) that are two-dimensionally disposed, for example. The light receiving element 1A of the present modification example differs from the above embodiment in that a color filter (CF) layer 31 having color filters of, for example, red (31R), green (31G), and blue (31B), and an on-chip lens 32 are provided in this order on each pixel P disposed in the pixel region R1 on the light incident surface side.

It is to be noted that the present modification example is applicable not only to the light receiving element 1 according to the above first embodiment but also to a light receiving element 2, light elements 3A to 3E described later in the same manner.

2-2. Modification Example 2

Figure 10:
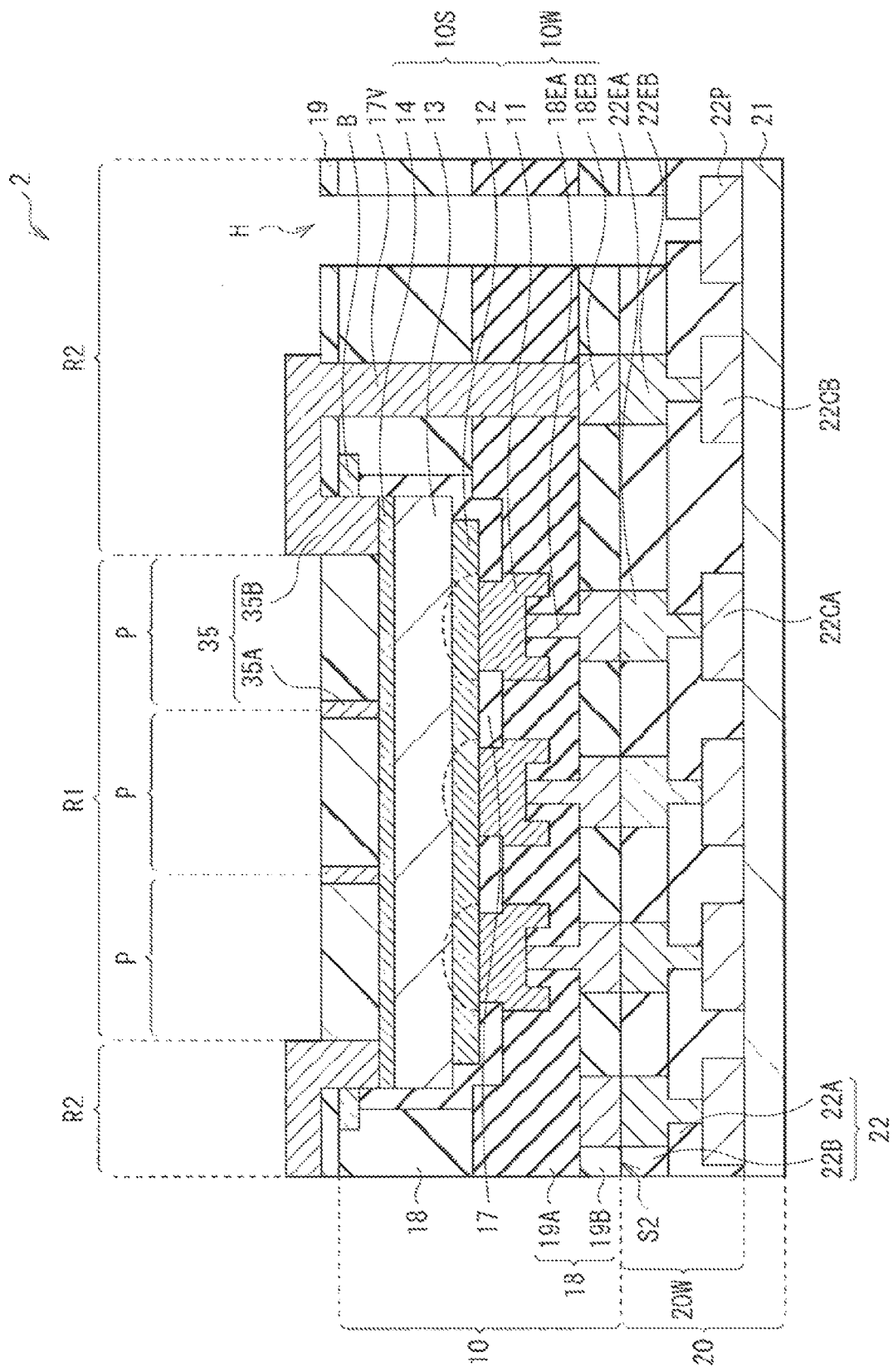
FIG. 10 is a cross-sectional schematic view illustrating a schematic configuration of a light receiving element according to a modification example 2.

FIG. 10 schematically illustrates a cross-sectional configuration of a light receiving element (light receiving element 2) according to a modification example (modification example 2) of the present disclosure. The light receiving element 2 is applied to, for example, similarly to the light receiving element 1 in the above embodiment, an infrared sensor or the like using a compound semiconductor material such as a III-V group semiconductor or the like, and has a photoelectric conversion function to light having a wavelength of a visible region (e.g., more than or equal to 380 nm and less than 780 nm) to a short infrared region (e.g., more than or equal to 780 nm and less than 2400 nm), for example. The light receiving element 2 is provided with a plurality of two-dimensionally disposed light receiving unit regions (pixels P), for example. FIG. 10 illustrates a cross-sectional configuration of a portion corresponding to three pixels P.

The light receiving element 2 has a stacked structure of the element substrate 10 and the circuit board 20, similarly to the above embodiment. One surface of the element substrate 10 is the light incident surface (light incident surface S1), and a surface opposite to the light incident surface S1 is a surface (bonding surface S2) bonded to the circuit board 20. The element substrate 10 has the interlayer insulating films 18 (18B and 18A), the second contact layer 12, the photoelectric conversion layer 13, the first contact layer 14, and the first electrode 15 stacked in this order, and has a photoelectric converter 10S common to the plurality of pixels P. In the present embodiment, first electrodes 35 (35A and 35B) having a light-shielding property are provided between the plurality of pixels P on the light incident surface S1 side of the photoelectric converter 10S.

The first electrode 35A is provided over the first contact layer 14, for example, between the plurality of pixels P adjacent to each other in a so-called lattice shape, and is provided so as to penetrate the passivation film 19. The first electrode 35A is preferably formed using a metal which has conductivity and is able to form an ohmic junction to the first contact layer 14. The first electrode 35A may have either a single-layer structure or a stacked structure, and preferably has a structure in which, for example, a barrier metal film and a metal film are stacked in this order from the first contact layer 14 side. As the barrier metal film, it is possible to use a titanium (Ti) film, a titanium nitride (TiN) film, or the like. As the metal film, it is possible to use a tungsten (W) film, a copper (Cu) film, an aluminum (Al) film, a silver (Ag) film, or the like. Accordingly, an ohmic contact is formed between the first contact layer 14 and the first electrode 15.

As illustrated in FIG. 10, for example, the first electrode 35B is electrically coupled to the wiring line 22CB via the penetration electrode 17V and the contact electrodes 18EB and 22EB in the peripheral region R2. The wiring line 22CB is coupled to a predetermined electric potential, for example, as described above. It is possible to set optionally the electric potential of the wiring line 2CB. For example, as described above, in a case where the electrons are taken out from the first electrode 35B, it is possible to promote the discharge of electrons by setting a positive voltage. Alternatively, the first electrode 35B may be directly coupled to an electrode outside the chip without using the penetration electrode 17V or the like.

As described above, in the light receiving element 2 according to the present modification example, the first electrode 35 is formed in the lattice shape between the pixels P adjacent to each other in a plan view, for example; therefore, the wiring resistance of the first electrode 35 is reduced. Therefore, it is possible to reduce the thickness of the first contact layer 14 and to improve the sensitivity.

Further, in the present modification example, the first electrodes 35 each having a light-shielding property are directly provided over the first contact layer 14; therefore, it is possible to shorten the manufacturing process and to further reduce the leakage of light from the adjacent pixel region as compared to the above embodiment. That is, the light-shielding performance owing to the first electrodes 35 is further improved, and it is possible to further reduce the generation of color mixture.

3. SECOND EMBODIMENT

Figure 11:
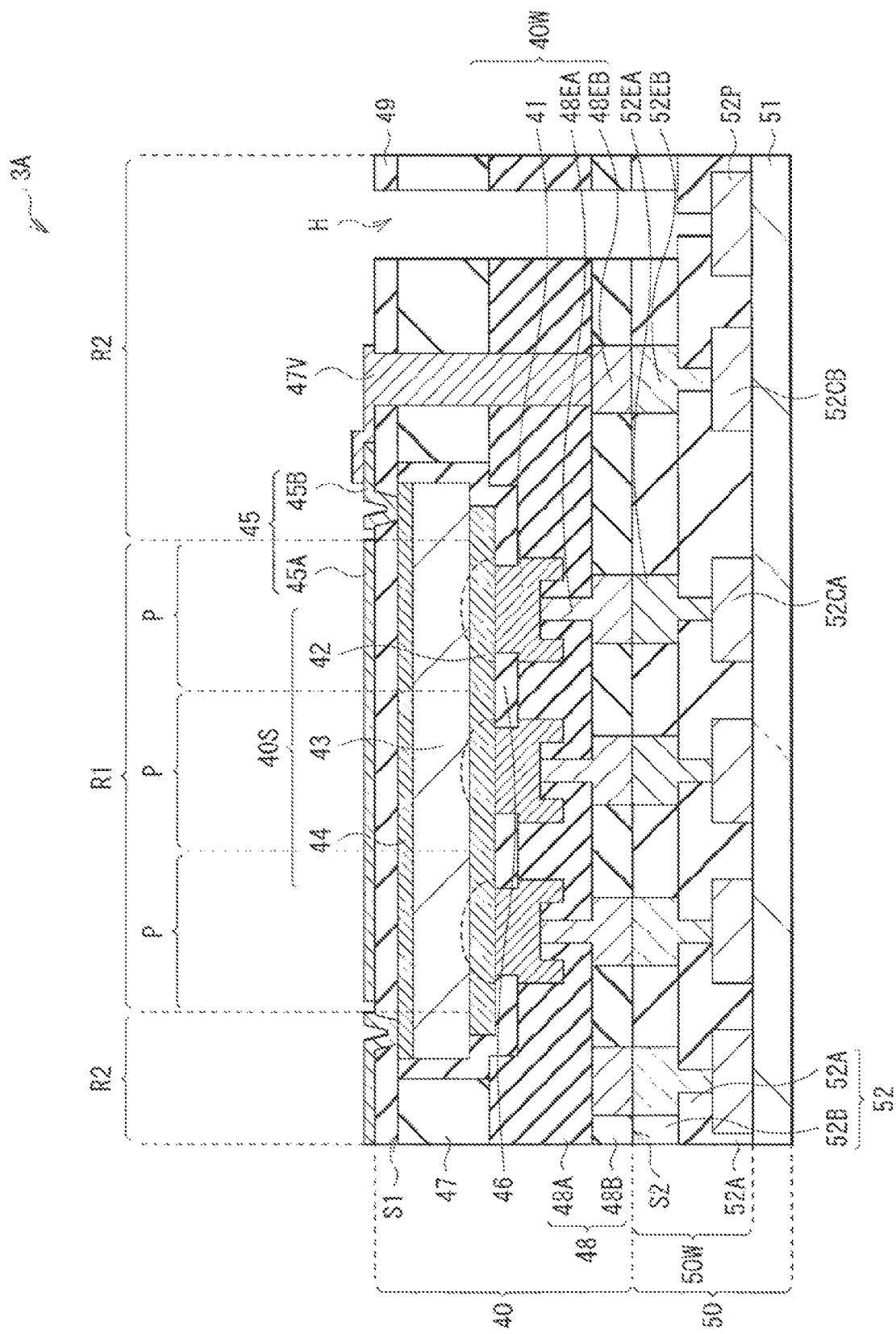
FIG. 11 is a cross-sectional schematic view illustrating a schematic configuration of a light receiving element according to a second embodiment of the present disclosure.

FIG. 11 schematically illustrates a cross-sectional configuration of a light receiving element (light receiving element 3A) according to a second embodiment of the present disclosure. FIG. 12 each schematically illustrate an overall plan configuration of the light receiving element 3A illustrated in FIG. 1. The light receiving element 3A is applied to, for example, an infrared sensor or the like using a compound semiconductor material such as a III-V group semiconductor or the like, and has a photoelectric conversion function to light having a wavelength of a visible region (e.g., more than or equal to 380 nm and less than 780 nm) to a short infrared region (e.g., more than or equal to 780 nm and less than 2400 nm), for example. The light receiving element 3A is provided with a plurality of light receiving unit regions (pixels P) that are two-dimensionally disposed, for example. FIG. 11 illustrates a cross-sectional configuration of a portion corresponding to three pixels P.

3-1. Configuration of Light Receiving Element

The light receiving element 3A has a stacked structure of an element substrate 40 and a circuit board 50. One surface of the element substrate 40 is a light incident surface (light incident surface S1), and a surface (another surface) opposite to the light incident surface S1 is a surface (bonding surface S2) bonded to the circuit board 50. The element substrate 40 has a structure in which interlayer insulating films 48 (48B and 48A), a second contact layer 42, a photoelectric conversion layer 43, a first contact layer 44, and a first electrode 45 are stacked in this order from the circuit board 50 side, and the second contact layer 42, the photoelectric conversion layer 43, and the first contact layer 44 configures a photoelectric converter 40S common to the plurality of pixels P. In the present embodiment, for example, the first electrode 45 common to each pixel is provided via the insulating layer 49 on the light incident surface S1 side of the photoelectric converter 40S.

The element substrate 40 includes a wiring layer 40W including the interlayer insulating films 48B and 48A and the second electrode 41, the photoelectric converter 40S, and the first electrode 45 in this order from a position close to the circuit board 50. A surface of the photoelectric converter 40S that opposes the wiring layer 40W and an end surface (side surface) of the photoelectric converter 40S are covered with an insulating film 46. The circuit board 50 includes a wiring layer 50W in contact with the bonding surface S2 of the element substrate 40 and a support base 51 that opposes the element substrate 40 with the wiring layer 50W interposed therebetween.

A pixel region R1, which is a light receiving region, is provided in a center portion of the element substrate 40, and the photoelectric converter 40S is disposed in the pixel region R1. In other words, a region in which the photoelectric converter 40S is provided is the pixel region R1. A peripheral region R2 surrounding the pixel region R1 is provided outside the pixel region R1. The peripheral region R2 of the element substrate 40 is provided with an embedded layer 47 along with the insulating film 46. In the present embodiment, as described above, the first electrode 45 is provided over the photoelectric converter 40S via the insulating layer 49. A signal charge photoelectrically converted by the photoelectric converter 40S travels through the wiring layer 40W and is read out by the circuit board 50. Hereinafter, a configuration of each section will be described.

The wiring layer 40W includes, for example, the second electrode 41 and contact electrodes 48EA and 48EB in the interlayer insulating films 48 (48A and 48B).

The interlayer insulating films 48 (48A and 48B) are provided over the pixel region R1 and the peripheral region R2, and include the bonding surface S2 with the circuit board 50. The bonding surface S2 in the pixel region R1 and the bonding surface in the peripheral region R2 form the same plane. The interlayer insulating films 48A and 48B are in a stacked structure, for example, the interlayer insulating film 48A is disposed on the second contact layer 42 side, and the interlayer insulating film 48B is disposed on the circuit board 50 side. The interlayer insulating films 48A and 48B include an inorganic insulating material, for example. Examples of the inorganic insulating material include silicon nitride (SiN), aluminum oxide (Al2O3), silicon oxide (SiO2), hafnium oxide (HfO2), and the like. The interlayer insulating films 48A and 48B may each be formed using inorganic insulating materials that differ from each other, or may each be formed using the same inorganic insulating material.

The second electrode 41 is an electrode (anode) to which a voltage for reading out a signal charge (a hole or an electron, hereinafter, for convenience, described on the assumption that the signal charge is a hole) generated in the photoelectric conversion layer 43 is supplied, and is provided for each pixel P in the pixel region R1. The second electrode 41 provided in the wiring layer 40W is in contact with the photoelectric converter 40S (more specifically, the second contact layer 42 to be described later) via connection holes of the interlayer insulating film 18A and the insulating film 46. Second electrodes 41 adjacent to each other are electrically separated by the interlayer insulating film 48B and the insulating film 46.

The second electrode 41 includes, for example, any one of titanium (Ti), tungsten (W), titanium nitride (TiN), platinum (Pt), gold (Au), germanium (Ge), palladium (Pd), zinc (Zn), nickel (Ni), and aluminum (Al), or an alloy containing at least one of those. The second electrode 41 may be a single film of such materials, or may be a stacked film in which two or more materials are combined. For example, the second electrode 41 is configured as a stacked film of titanium and tungsten.

The contact electrode 48EA electrically couples the second electrode 41 to the circuit board 50, and is provided for each pixel P in the pixel region R1. The contact electrodes 48EA adjacent to each other are electrically separated by the interlayer insulating film 48B.

The contact electrode 48EB electrically couples the first electrode 45 to a wiring line (a wiring line 52CB to be described later) of the circuit board 50, and is disposed in the peripheral region R2. The contact electrode 48EB is formed, for example, by the same process as the contact electrode 48EA. The contact electrodes 48EA and 48EB each include, for example, a copper (Cu) pad, and are exposed to the bonding surface S2.

The photoelectric converter 40S includes, for example, the second contact layer 42, the photoelectric conversion layer 43, and the first contact layer 44, from a position close to the wiring layer 40W. The second contact layer 42, the photoelectric conversion layer 43, and the first contact layer 44 have substantially the same planar shapes.

The second contact layer 42 is, for example, provided in common to all pixels P, and is disposed between the insulating film 46 and the photoelectric conversion layer 43. The second contact layer 42 electrically separates the pixels P adjacent to each other, and the second contact layer 42 is provided with, for example, a plurality of diffusion regions 12A. It is possible to suppress a dark current by the second contact layer 42 including a compound semiconductor material having a band gap larger than a band gap of the compound semiconductor material included in the photoelectric conversion layer 43. For example, it is possible for the second contact layer 42 to include n-type InP (indium phosphide).

The diffusion regions 12A provided in the second contact layer 42 are spaced apart from each other. The diffusion region 12A is disposed for each pixel P, and the second electrode 41 is coupled to each diffusion region 12A. The diffusion region 12A reads out a signal charge generated in the photoelectric conversion layer 43 for each pixel P, and includes, for example, a p-type impurity. As the p-type impurity, there are given Zn (zinc) and the like. In this manner, a p-n junction interface is formed between the diffusion region 12A and the second contact layer 42 other than the diffusion region 12A, and the pixels P adjacent to each other are electrically isolated. The diffusion region 12A is provided, for example, in a thickness direction of the second contact layer 42, and is also provided in a portion of a thickness direction of the photoelectric conversion layer 43.

The photoelectric conversion layer 43 between the second electrode 41 and the first electrode 45, more specifically, between the second contact layer 42 and the first contact layer 44, is provided in common to all pixels P, for example. The photoelectric conversion layer 43 absorbs light of a predetermined wavelength to generate a signal charge, and includes, for example, a compound semiconductor material such as a III-V group semiconductor of i-type. Examples of the compound semiconductor material included in the photoelectric conversion layer 43 include InGaAs (indium gallium arsenide), InAsSb (indium arsenide antimony), InAs (indium arsenide), InSb (indium antimony), HgCdTe (mercury cadmium tellurium), and the like. The photoelectric conversion layer 43 may include Ge (germanium). In the photoelectric conversion layer 43, photoelectric conversions are performed on light having a wavelength of from a visible region to a short infrared region, for example.

The first contact layer 44 is provided in common to all pixels P, for example. The first contact layer 44 is provided between and in contact with the photoelectric conversion layer 43 and the first electrode 45. The first contact layer 44 is a region through which an electric charge discharged from the first electrode 45 travels, and includes, for example, a compound semiconductor containing an n-type impurity. For example, it is possible for the first contact layer 44 to include n-type InP (indium phosphorus). The first contact layer 44 has the thickness of, for example, more than or equal to 10 nm and less than or equal to 300 nm.

The insulating layer 49 controls a carrier density of the first contact layer 44, and is configured as a single layer film of, for example, silicon oxide (SiOX), silicon nitride (SiN), and silicon oxynitride (SiON), or a stacked film thereof. The thickness of the insulating layer 49 is, for example, more than or equal to 10 nm and less than or equal to 200 nm.

The first electrode 45 includes first electrodes 45A and 45B separated from each other. The first electrode 45A is provided over the entire surface of the pixel region R1, for example, as an electrode common to all pixels P. The first electrode 45B is provided in the peripheral region R2 and is electrically coupled to the first contact layer 44. The first electrode 45 (in particular, the first electrode 45B) (cathode) is used to discharge electric charges that are not used as signal charges among the electric charges generated in the photoelectric conversion layer 43. The first electrode 45 includes, for example, a conductive film that is able to transmit incident light such as infrared light. As a material of the first electrode 45, for example, it is possible to use a transparent conductive material such as ITO (Indium Tin Oxide), ITiO (In2O3-TiO2), or the like. It is to be noted that the first electrode 45B may include a metal film included in a light-shielding film 61 in addition to the transparent conductive materials.

The first electrode 45A is not electrically coupled to the photoelectric converter 40S. As described above, one side of the first electrode 45B is electrically coupled to the first contact layer 44, and another side is electrically coupled to the penetration electrode 47V. One side of the penetration electrode 47V is coupled to the first electrode 45B and another side of the penetration electrode 47V penetrates through the interlayer insulating film 48A and is coupled to the contact electrode 48EB which is electrically coupled to the wiring line 52CB and a contact electrode 52EB provided in the peripheral region R2 of the circuit board 50. For example, in a case where holes are read out from the second electrode 41 as signal charges, electrons are discharged through the first electrode 45B electrically coupled to the first contact layer 44. Specifically, for example, by applying a positive electric potential to the first electrode 45A, the concentration of electric charges (specifically, the electron concentration) on the surface (specifically, the first contact layer 44) of the photoelectric converter 40S increases, thereby lowering the resistance of the first contact layer 44. The electric charges (electrons) extracted via the first contact layer 44 having a decreased resistance are discharged via the first electrode 45B, the penetration electrode 47V, the contact electrodes 48EB and 52EB, and the wiring line 52CB, in the peripheral region R2. Thus, by extracting electric charges from the first electrode 45B, it is possible to reduce the thickness of the first contact layer 44.

The insulating film 46 is provided between the second contact layer 42 and the wiring layer 40W, covers an end surface of the second contact layer 42, an end surface of the photoelectric conversion layer 43, an end surface of the first contact layer 44, and an end surface of the cap layer 15A, and is in contact with the light-shielding film 15B in the peripheral region R2. The insulating film 46 includes, for example, an oxide such as silicon oxide ($SiO_x$), aluminum oxide ($Al_2O_3$), or the like. The insulating film 46 may be configured as a stacked structure including a plurality of films. The insulating film 46 may include a silicon (Si)-based insulating material such as silicon oxynitride (SiON), carbon-containing silicon oxide (SiOC), silicon nitride (SiN), silicon carbide (SiC), or the like, for example.

The embedded layer 47 fills a step between a temporary substrate (e.g., the temporary substrate 73) and the photoelectric converter 40S in a manufacturing process of the light receiving element 1.

The embedded layer 47 in the peripheral region R2 is provided between the wiring layer 40W and the insulating layer 49, and has a thickness more than or equal to the thickness of the photoelectric converter 40S, for example. Here, since the embedded layer 47 is provided so as to surround the photoelectric converter 40S, a region (peripheral region R2) is formed around the photoelectric converter 40S. Thus, it is possible to provide the bonding surface S2 with the circuit board 50 in the peripheral region R2. If the bonding surface S2 is formed in the peripheral region R2, the thickness of the embedded layer 47 may be reduced; however, it is preferable that the embedded layer 47 cover the photoelectric converter 40S over the thickness direction, and that the embedded layer 47 cover the entire surface of the end surface of the photoelectric converter 40S. By covering the entire end surface of the photoelectric converter 40S with the embedded layer 47 via the insulating film 16, it is possible to effectively suppress ingress of water into the photoelectric converter 40S.

A surface of the embedded layer 47 on the bonding surface S2 side is flattened, and is provided with the wiring layer 40W on the flattened surface of the embedded layer 47 in the peripheral region R2. For the embedded layer 47, for example, it is possible to use an inorganic insulating material such as silicon oxide (SiOX), silicon nitride (SiN), silicon oxynitride (SiON), carbon-containing silicon oxide (SiOC), silicon carbide (SiC), or the like.

The embedded layer 47 is provided with the penetration electrode 47V having a light-shielding property, for example. The penetration electrode 47V electrically couples the first electrode 45B and the wiring line 52CB of the circuit board 50. One side of the penetration electrode 47V is coupled to the first electrode 45B. Another side of the penetration electrode 47V penetrates through the insulating film 46, the embedded layer 47, and the interlayer insulating film 48A, and is coupled to the contact electrode 48EB provided in the peripheral region.

The support base 51 of the circuit board 50 supports the wiring layer 50W and includes, for example, silicon (Si). The wiring layer 50W includes, for example, contact electrodes 52EA and 52EB, a pixel circuit 52CA, the wiring line 52CB, and a pad electrode 52P, in the interlayer insulating film 52A. The interlayer insulating film 52A includes an inorganic insulating material, for example. Examples of the inorganic insulating material include silicon nitride (SiN), aluminum oxide ($Al_2O_3$), silicon oxide ($SiO_2$), hafnium oxide ($HfO_2$), and the like.

The contact electrode 52EA electrically couples the second electrode 41 and the pixel circuit 52CA, and is in contact with the contact electrode 48EA at the bonding surface S2 of the element substrate 40. Contact electrodes 52EA adjacent to each other are electrically separated by the interlayer insulating film 52A.

The contact electrode 52EB electrically couples the first electrode 45 and the wiring line 52CB of the circuit board 50, and is in contact with the contact electrode 48EB at the bonding surface S2 of the element substrate 40. The contact electrode 52EB is formed by the same process as the contact electrode 52EA, for example. The penetration electrode 47V may be coupled to the wiring line 52CB without providing the contact electrodes 48EB and 52EB. The contact electrodes 52EA and 52EB each include, for example, a copper (Cu) pad, and are exposed on a surface, of the circuit board 50, opposing the element substrate 40. That is, a Cu—Cu bonding is formed each of between the contact electrode 48EA and the contact electrode 52EA and between the contact electrode 48EB and the contact electrode 52EB.

The pixel circuit 52CA is provided for each pixel P, and is coupled to the contact electrode 52EA. The pixel circuit 52CA includes a ROIC. The wiring line 52CB coupled to the contact electrode 52EB is coupled to, for example, a predetermined electric potential. In this way, one type of the electric charges (e.g., holes) generated in the photoelectric conversion layer 43 is read out from the second electrode 41 to the pixel circuit 52CA via the contact electrodes 48EA and 52EA, and the other type of the electric charges (e.g., electrons) generated in the photoelectric conversion layer 43 is discharged from the first electrode 45 to the predetermined electric potential via the penetration electrode 47V and the contact electrodes 48EB and 52EB.

The pad electrode 52P electrically couples to the outside. The light receiving element 1 is provided with an opening H which penetrates the element substrate 40 and reaches the pad electrode 52P, and is electrically coupled to the outside via the opening H. The coupling is achieved by, for example, wire bonding or bumping.

Figure 12A:
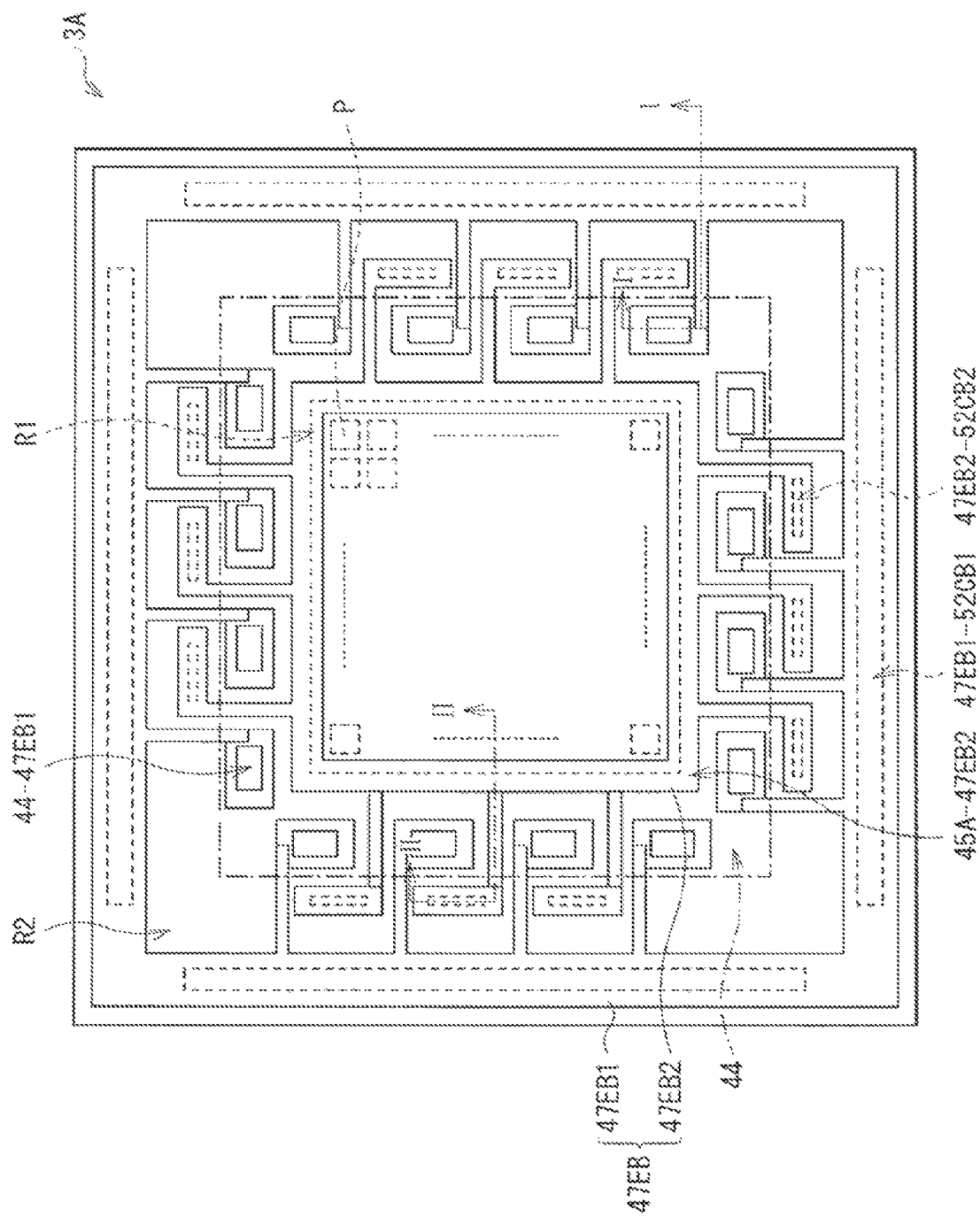
FIG. 12A is a plan schematic view illustrating an overall configuration of the light receiving element illustrated in FIG. 11.
Figure 12B:
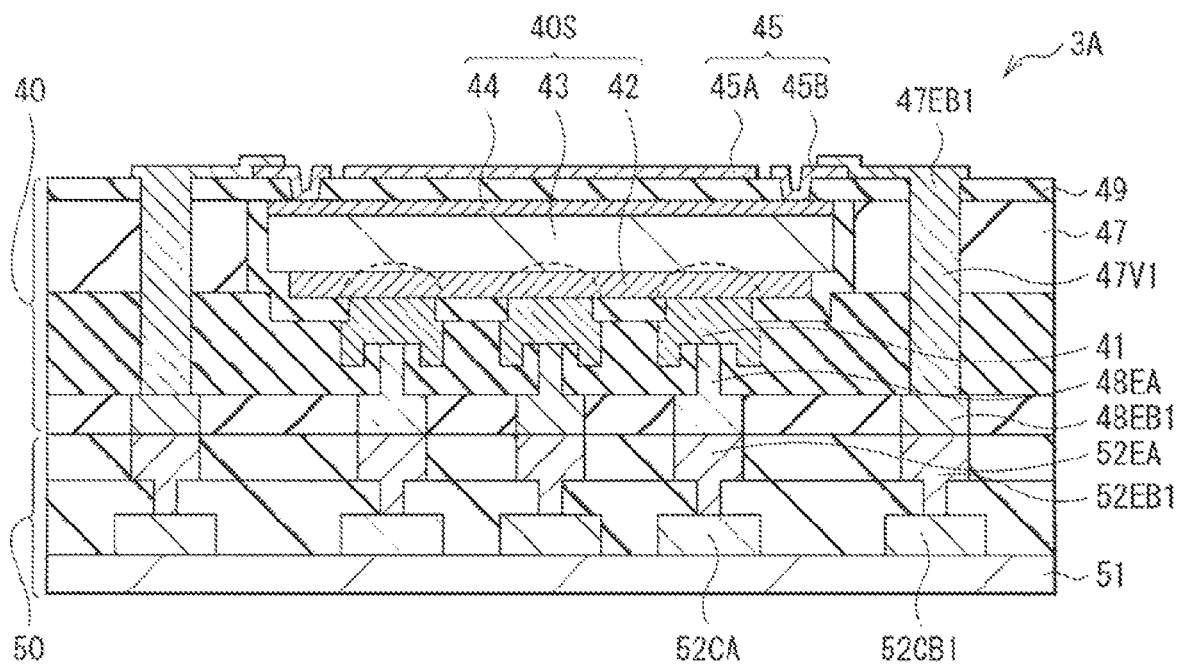
FIG. 12B is a cross-sectional schematic view illustrating the light receiving element taken along a line I-I illustrated in FIG. 12A.
Figure 12C:
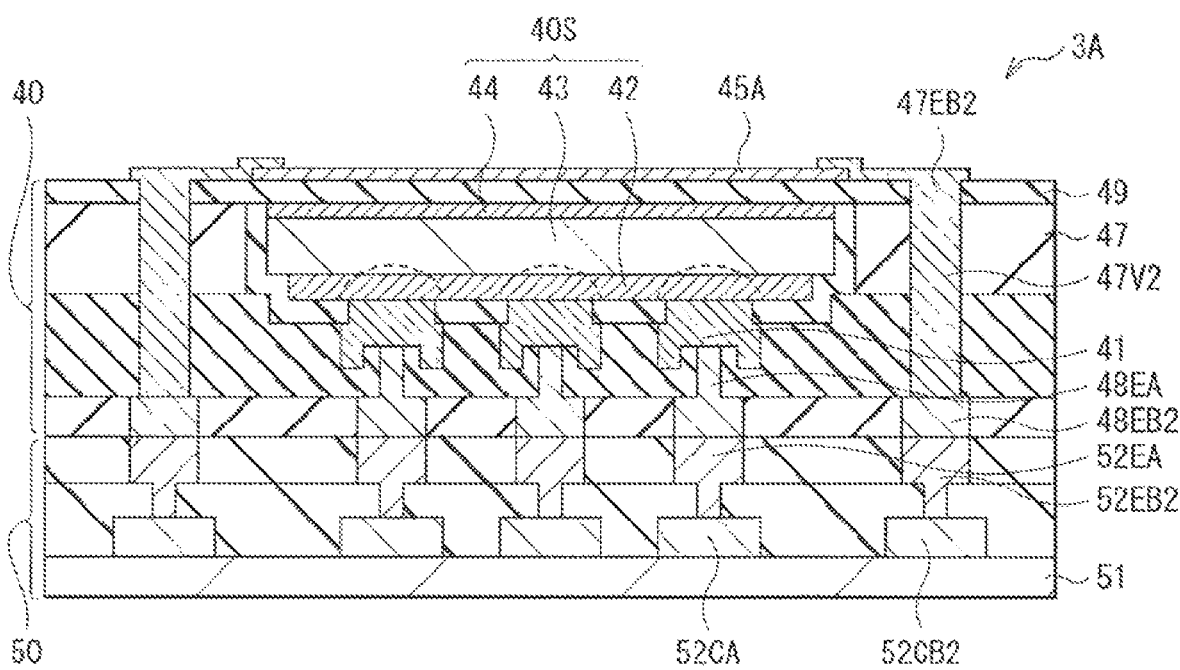
FIG. 12C is a cross-sectional schematic view illustrating the light receiving element taken along a line II-II illustrated in FIG. 12A.

Hereinafter, a method of obtaining the electric potential of the electrode for discharging electric charges via the first electrode 45 and an N-type layer will be described with reference to FIGS. 12A to 12C. FIG. 12A schematically illustrates an entire planar configuration of the light receiving element 3A according to the present embodiment. FIG. 12B schematically illustrates a cross-sectional configuration of the light receiving element 3A taken along a line I-I illustrated in FIG. 12A. FIG. 12C schematically illustrates a cross-sectional configuration of the light receiving element 3A taken along a line II-II illustrated in FIG. 12A. In the light receiving element 3A according to the present embodiment, in the peripheral region R2, a light-shielding wiring line 47EB electrically coupled to the first electrode 45 is routed and electrically coupled to the wiring line 52CB provided in the circuit board 50.

In order to apply different electric potentials to the first electrode 45A and the first electrode 45B, it is desirable that the first electrode 45A and the first electrode 45B respectively have wiring lines independent of each other, and are respectively electrically coupled to wiring lines 52CB1 and 52CB2, the wiring lines 52CB1 and 52CB2 also being provided independently of each other in the circuit board 50. In the present embodiment, as illustrated in FIGS. 12A and 12C, the first electrode 45A is electrically coupled (45A-47EB2) to a wiring line 47EB2 at the periphery of the pixel region R1 of the peripheral region R2, and is electrically coupled (47EB2-52CB2) to a wiring line 52CB2 provided over the circuit board 50 via a penetration electrode 47V2 and contact electrodes 48EB2 and 52EB2. As illustrated in FIGS. 12A and 12B, the first electrode 45B is electrically coupled (45B-47EB1) to a wiring line 47BE1 at the peripheral region R2 outside of the coupling portion between the first electrode 45A and the wiring line 47EB2, and is electrically coupled (47EB1-52CB1) to the wiring line 52CB1 provided at a perimeter portion of the peripheral region R2 over the circuit board 50 via a penetration electrode 47V1 and contact electrodes 48EB1 and 52EB1, for example. It is to be noted that the routing patterns of the respective wiring lines illustrated in FIGS. 12A to 12C are examples, and the present disclosure is not limited thereto.

3-2. Workings and Effects

It is desired that a semiconductor element (light receiving element) in which a photoelectric conversion layer includes a general compound semiconductor have a sufficiently increase the thickness of an N-type compound semiconductor layer, in order to sufficiently reduce the resistance of the N-type compound semiconductor layer formed on the light incident surface side. However, in a case where the N-type compound semiconductor layer includes InGaAs, there is an issue that an infrared absorption coefficient of InGaAs is high, and a resistance as the electron-extraction wiring line is lowered due to the increase in thickness, but the photoelectric conversion efficiency of infrared light is lowered.

In contrast, in a case where the N-type compound semiconductor layer includes InP, the InP layer has a large band gap and an absorption of the infrared region is suppressed, so that it is possible to suppress the reduction in the infrared photoelectric conversion efficiency as compared to the infrared photoelectric conversion efficiency of the InGaAs layer. Further, the InP layer is also able to suppress generation of a dark current caused by a defective level of an insulating film formed over a surface of the compound semiconductor layer because of the large band gap of the InP layer. However, the InP layer has a high absorption coefficient to light of the visible light region, and the InP layer may have a low sensitivity in an image sensor that causes the visible light to the infrared light to be photoelectrically converted simultaneously.

In the present embodiment, the insulating layer 49 is provided on the light incident surface side of the photoelectric converter 40S in which the second contact layer 42, the photoelectric conversion layer 43, and the first contact layer 14 are stacked in this order toward the light incident surface, and the first electrode 45 is formed via the insulating layer 49. It is possible to apply a predetermined voltage to the first electrode 45, thus, it becomes possible to increase a carrier density of the first contact layer 44. Therefore, it is possible to reduce the resistance without increasing the thickness of the first contact layer 44.

As described above, in the light receiving element 3A according to the present embodiment, the first electrode 45 is formed over the photoelectric converter 40S via the insulating layer 49. By applying a predetermined voltage to the first electrode 45, the carrier concentration of the first contact layer 44 is increased and the resistance of the first contact layer 44 is reduced. Therefore, it is possible to reduce the thickness of the first contact layer 44, and to increase the sensitivity.

4. MODIFICATION EXAMPLES

4-1. Modification Example

Figure 13:
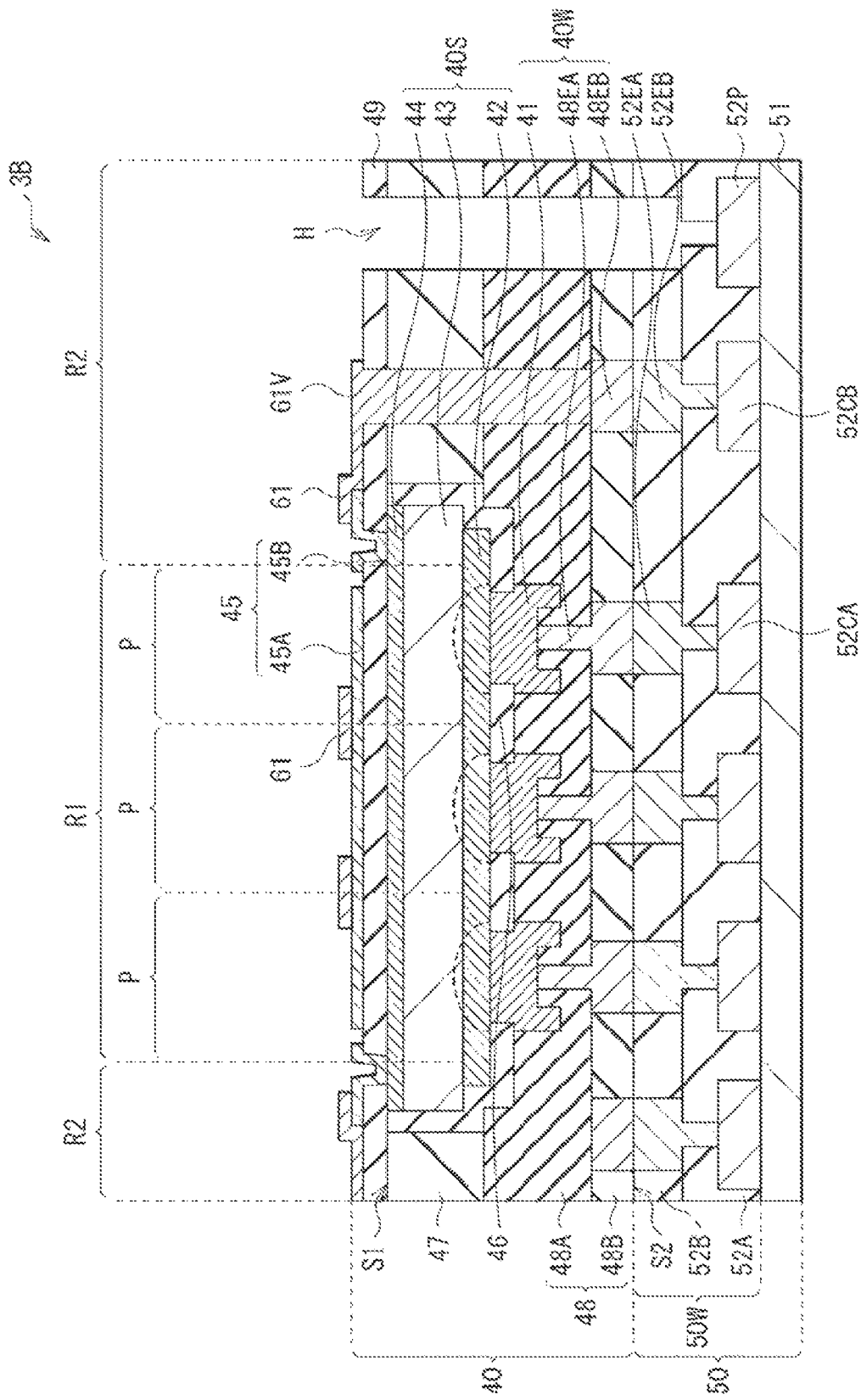
FIG. 13 is a cross-sectional schematic view illustrating a schematic configuration of a light receiving element according to a modification example 3.

FIG. 13 schematically illustrates a cross-sectional configuration of a light receiving element (light receiving element 3B) according to a present modification example (modification example 3) of the present disclosure. The light receiving element 3B is applied to, for example, similarly to the light receiving element 3A according to the second embodiment, an infrared sensor or the like using a compound semiconductor material such as a III-V group semiconductor or the like, and has a photoelectric conversion function to light having a wavelength of a visible region (e.g., more than or equal to 380 nm and less than 780 nm) to a short infrared region (e.g., more than or equal to 780 nm and less than 2400 nm), for example. The light receiving element 3A according to the present modification example differs from the second embodiment in that a light-shielding film 61 electrically coupled to the first electrode 45 is provided over the first electrode 45.

The light-shielding film 61 is provided around the pixel region R1 as an optical black region (OPB region) for determining a signal of a black reference, is provided between the pixels P adjacent to each other, for example, and is formed in a lattice shape in a plan view, for example. In addition, the light-shielding film 61 is formed using a conductive material; therefore, it is possible to use the light-shielding film 61 as a parallel wiring line of the first electrode 45, and to reduce the resistance of the first electrode 45. Further, the light-shielding film 61 is formed using a conductive material, and thus making it possible to serve as the penetration electrode 47V according to the second embodiment (a penetration electrode 61V). As the light-shielding film 61, it is possible to use a tungsten (W) film, a copper (Cu) film, an aluminum (Al) film, and a silver (Ag) film, or a stacked film thereof.

In the light receiving element 3B according to the present modification example, the first electrode 45 in the pixel region R1 includes the first electrode 45A that is not electrically coupled to the photoelectric converter 40S, and the first electrode 45B that is electrically coupled to the first contact layer 44 of photoelectric converter 40S, similarly to the second embodiment described above. In the first contact layer 44, for example, by a positive electric potential being applied, an electric charge concentration (specifically, an electron concentration) of a surface (specifically, the first contact layer 44) of the photoelectric converter 40S is increased and the resistance is reduced. In the similar manner to the second embodiment, the first electrode 45B is electrically coupled to the wiring line 52CB provided in the circuit board 50 via the penetration electrode 61V and the contact electrodes 48EB and 52EB. In the similar manner to the first electrode 45A, a positive electric potential is applied to the first electrode 45B, and electric charges (electrons) extracted via the first contact layer 44 in which the resistance is lowered are discharged via the first electrode 45B. It is to be noted that the first electrode 45B may include a metal film included in the light-shielding film 61 in addition to a transparent conductive material.

As described above, in the present modification example, the light-shielding film 61 is formed between the pixels P adjacent to each other over the first electrode 45 in the pixel region R1; therefore, it is possible to suppress generation of crosstalk between the pixels P. Accordingly, in addition to the effects of the second embodiment, it is possible to achieve the effect that the generation of color mixture is reduced. In addition, the light-shielding film 61 is formed using a metal film; therefore, it is possible to use the light-shielding film 61 as a parallel wiring line of the first electrode 45A. This enables the resistance of the first electrode 45 to be lowered.

4-2. Modification Example 4

Figure 14:
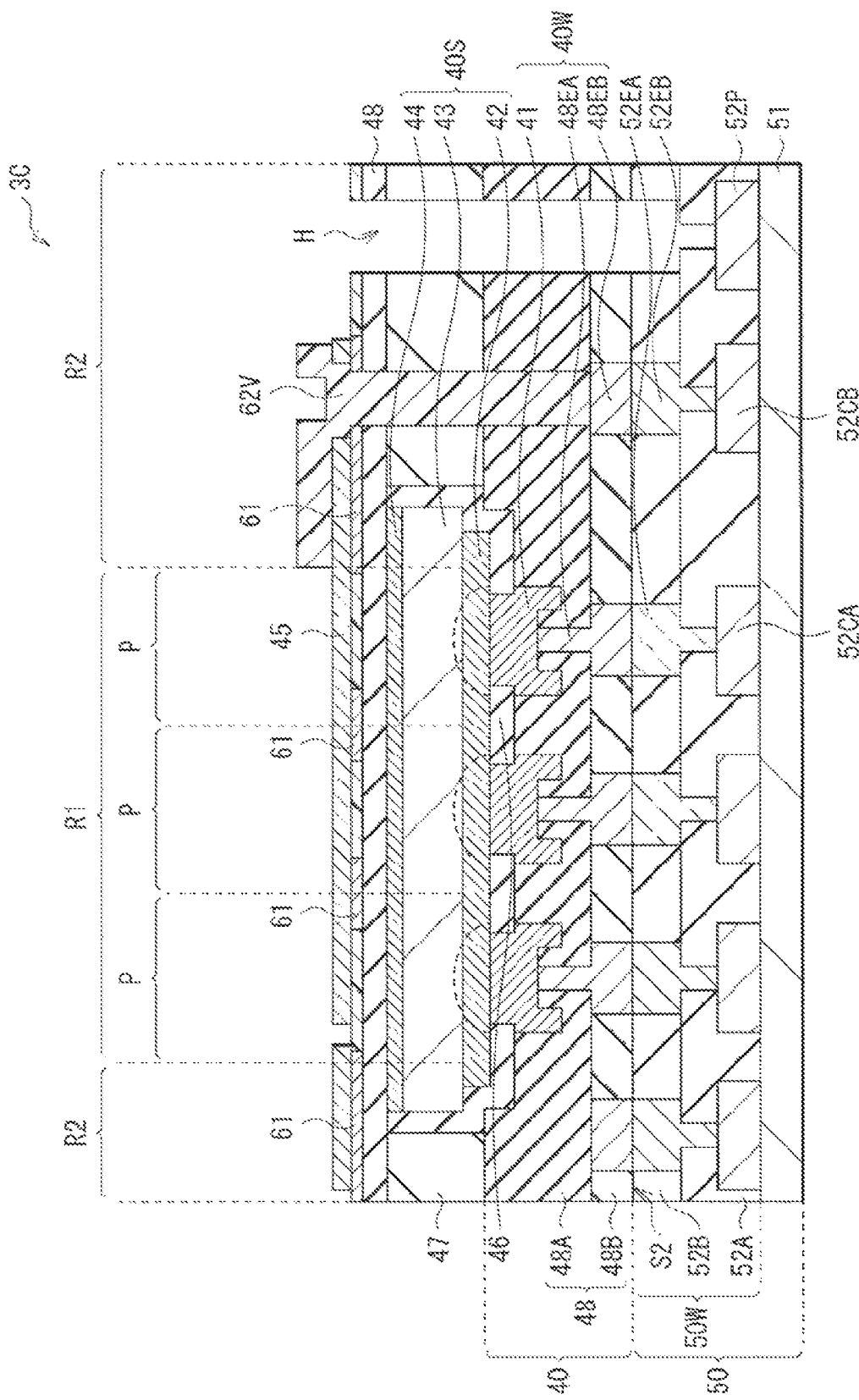
FIG. 14 is a cross-sectional schematic view illustrating a schematic configuration of a light receiving element according to a modification example 4.

FIG. 14 schematically illustrates a cross-sectional configuration of a light receiving element (light receiving element 3C) according to a present modification example (modification example 4) of the present disclosure. The light receiving element 3C is applied to, for example, similarly to the light receiving element 3A according to the second embodiment, an infrared sensor or the like using a compound semiconductor material such as a III-V group semiconductor or the like, and has a photoelectric conversion function to light having a wavelength of a visible region (e.g., more than or equal to 380 nm and less than 780 nm) to a short infrared region (e.g., more than or equal to 780 nm and less than 2400 nm), for example. The light receiving element 3C according to the present modification example differs from the second embodiment in that the light-shielding film 61 is provided between the insulating layer 49 and the first electrode 45.

As described above, the light-shielding film 61 is formed below the first electrode 45, and thus enables to shield light at a position closer to the photoelectric converter 40S; therefore, it is possible to suppress generation of crosstalk between the pixels P.

It is to be noted that, in the present modification example, a penetration electrode (a penetration electrode 62V), which is responsible for electrically coupling the first electrode 45 and the circuit board 50, is provided separately, and for example, one end of the penetration electrode 62V is formed so as to extend over the first electrode 45 in the peripheral region R2.

4-3. Modification Example 5

Figure 15:
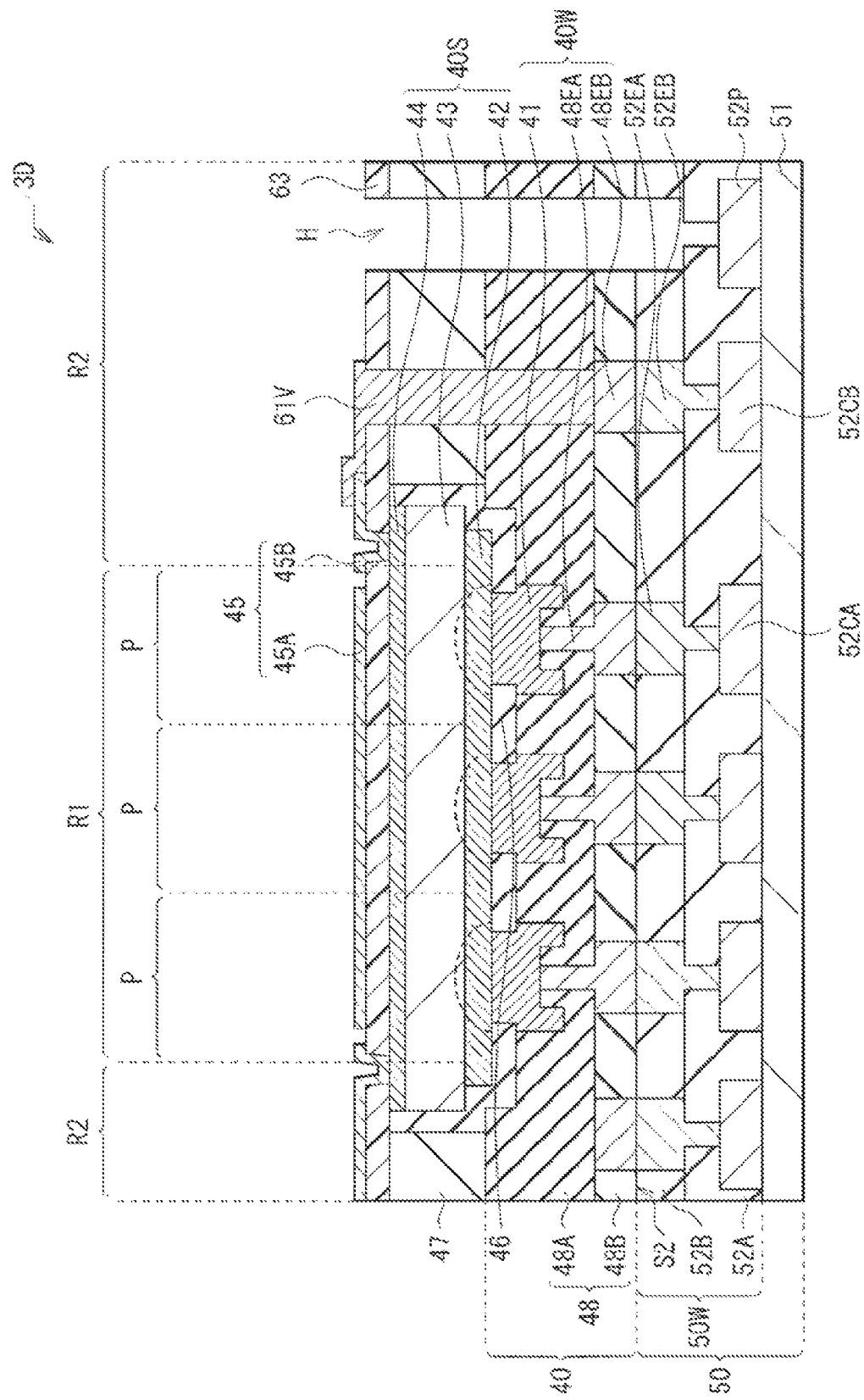
FIG. 15 is a cross-sectional schematic view illustrating a schematic configuration of a light receiving element according to a modification example 5.

FIG. 15 schematically illustrates a cross-sectional configuration of a light receiving element (modification example 5) according to a present modification example (modification example 5) of the present disclosure. The light receiving element 3D is applied to, for example, similarly to the light receiving element 3A according to the second embodiment, an infrared sensor or the like using a compound semiconductor material such as a III-V group semiconductor or the like, and has a photoelectric conversion function to light having a wavelength of a visible region (e.g., more than or equal to 380 nm and less than 780 nm) to a short infrared region (e.g., more than or equal to 780 nm and less than 2400 nm), for example. The light receiving element 3D according to the present modification example differs from the second embodiment in that a carrier-induction film 63, in place of the insulating layer 49, is provided between the photoelectric converter 40S and the first electrode 45.

The carrier-induction film 63 increases a carrier density on a surface of the photoelectric converter 40S to decrease the resistance. It is desirable that the carrier-induction film 63 causes an interface level with the photoelectric converter 40S to be reduced, and for example, it is preferable to have a two-layer structure of an interface level reduction film and a film that promotes carrier induction. For example, in a case where electrons are induced as electric charges, it is preferable to use a silicon oxide (SiOx) film formed by, for example, an ALD method as the interface level reduction film. Examples of the film that promotes carrier induction include an insulating film having a positive fixed electric charge, and for example, a silicon nitride (SiN) film or a silicon oxynitride (SiON) film having a positive (+) electric charge is preferably used. In a case where holes are induced as electric charges, it is preferable to use a silicon oxide (SiOx) film formed by, for example, an ALD method as the interface level reduction film. Examples of the film that promotes carrier induction include an insulating film having a negative fixed electric charge, and for example, an insulating film containing at least one element selected from hafnium (Hf), zirconium (Zr), aluminum (Al), tantalum (Ta), titanium (Ti), yttrium (Y), and lanthanides is preferably used.

4-4. Modification Example 6

Figure 16:
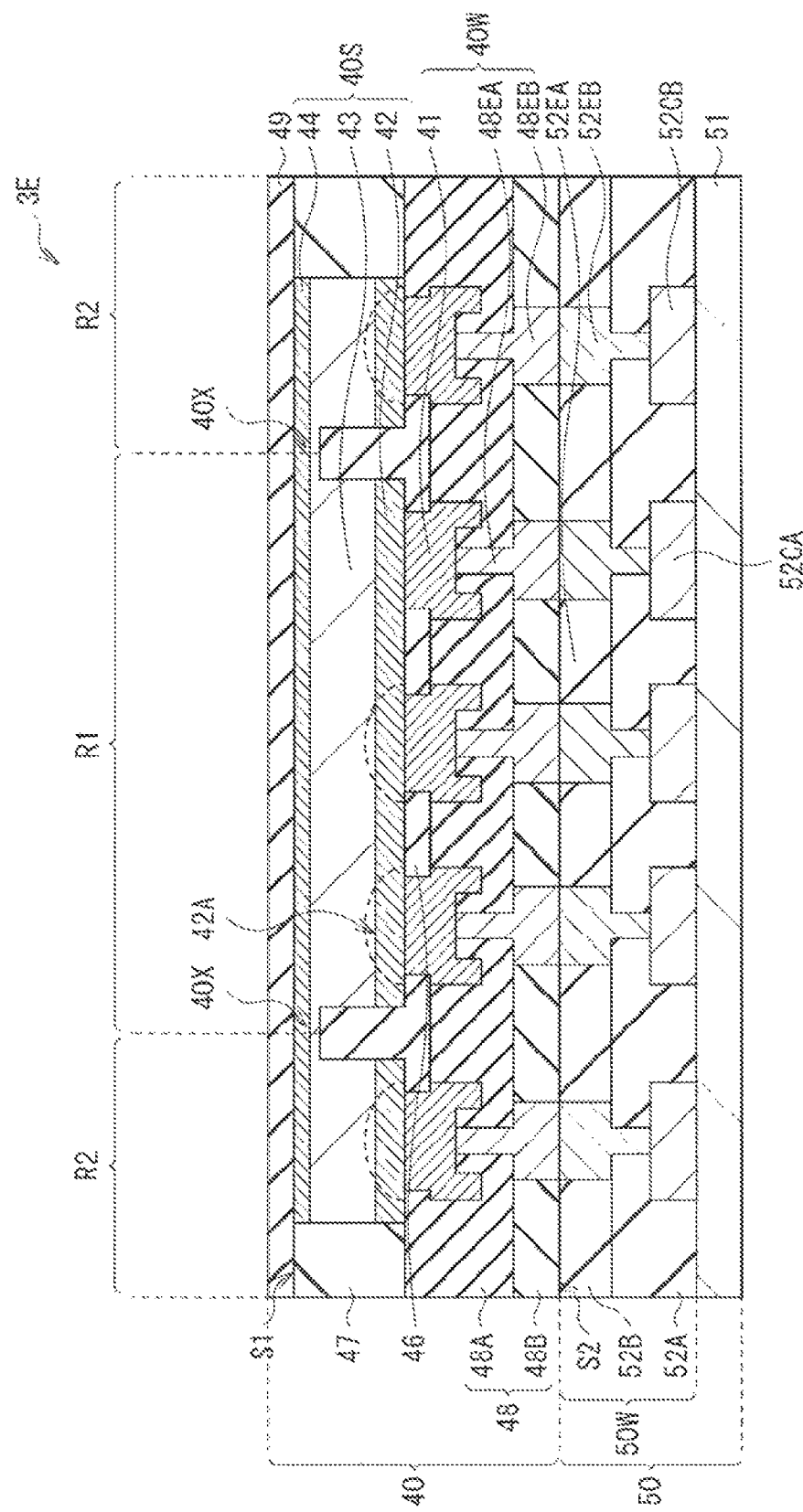
FIG. 16 is a cross-sectional schematic view illustrating a schematic configuration of a light receiving element according to a modification example 6.

FIG. 16 schematically illustrates a cross-sectional configuration of a light receiving element (light receiving element 3E) according to a present modification example (modification example 6) of the present disclosure. The light receiving element 3E is applied to, for example, similarly to the light receiving element 3A according to the second embodiment, an infrared sensor or the like using a compound semiconductor material such as a III-V group semiconductor or the like, and has a photoelectric conversion function to light having a wavelength of a visible region (e.g., more than or equal to 380 nm and less than 780 nm) to a short infrared region (e.g., more than or equal to 780 nm and less than 2400 nm), for example. The light receiving element 3E according to the present modification example differs from the second embodiment in that electric charges are discharged via the first contact layer 44.

The light receiving element 3E according to the present modification example has a trench 40X narrowed to the first contact layer 44 side in the photoelectric converter 40S between the pixel region R1 and the peripheral region R2. Accordingly, in the light receiving element 3E, the holes of the electric charges generated in the photoelectric conversion layer 43 are read out to the pixel circuit 52CA via the contact electrodes 48EA and 52EA provided in the pixel region R1. The electrons are discharged to the wiring line 52CB via the contact electrodes 48EB and 52EB provided in the peripheral region R2 via an N-type region (the first contact layer 44).

As described above, in the present modification example, the trench 40X narrowed to the first contact layer 44 side is provided in the photoelectric converter 40S between the pixel region R1 and the peripheral region R2; therefore, the contact electrode 48EB is electrically coupled to the photoelectric converter 40S in the pixel region R1 via the first contact layer 44. As a result, it is possible to uniformly apply, in the pixel region R1, an electric field to the N-type region (the first contact layer 44) and a P-type region (a diffusion region 42A) provided for each pixel.

5. APPLICATION EXAMPLES

Application Example 1

Figure 17:
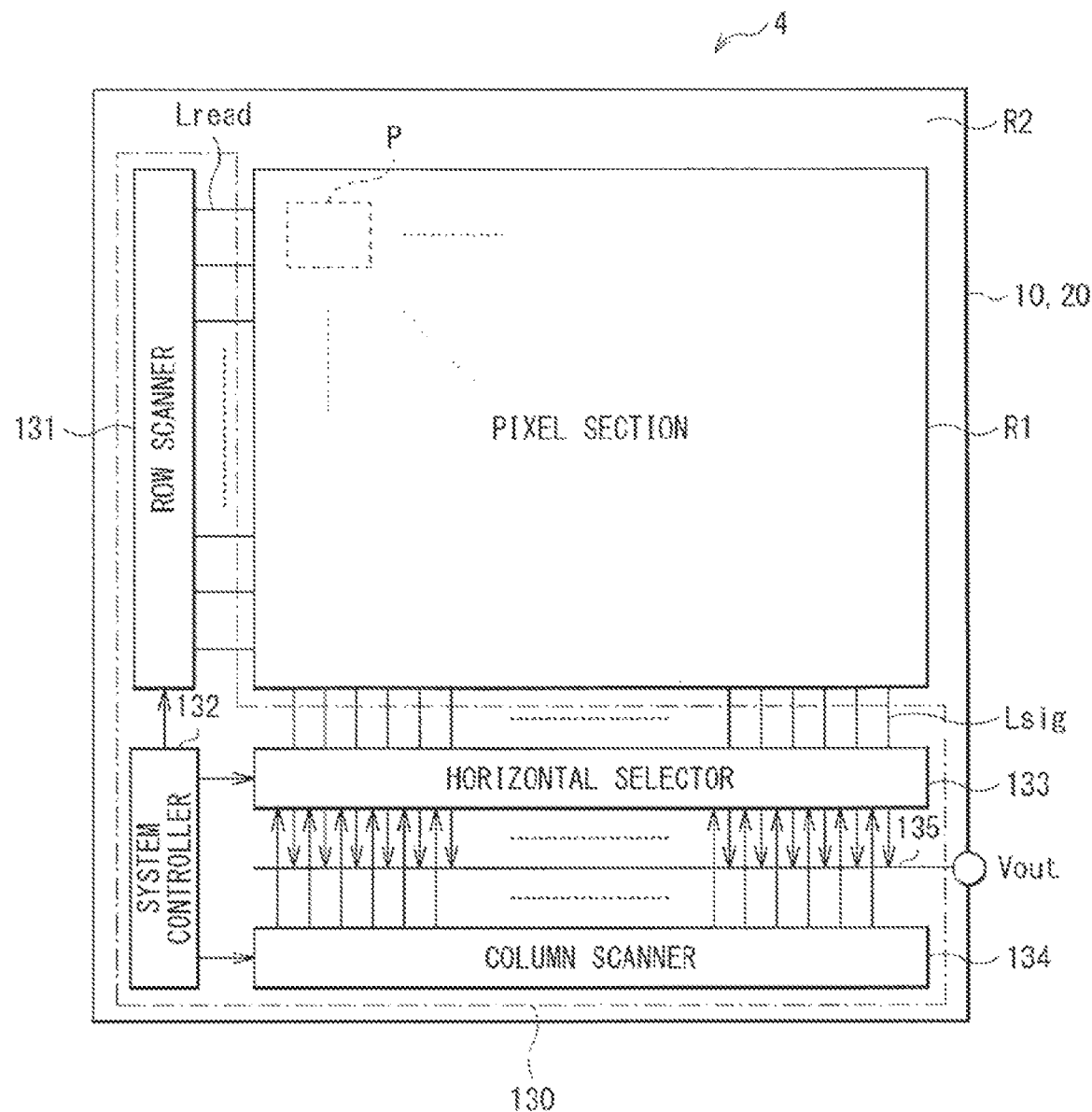
FIG. 17 is a block diagram illustrating a configuration of a solid-state imaging device.

FIG. 17 illustrates a functional configuration of an imaging element 4 using an element structure of the light receiving element 1 (or the light receiving elements 1, 1A, 2, 3A to 3E, hereinafter, collectively referred to as light receiving element 1) described in the foregoing embodiment, etc. The imaging element 4 is, for example, an infrared image sensor, and includes, for example, a pixel region R1 provided in the light receiving element 1 and a circuit section 130 that drives the pixel region R1. The circuit section 130 includes, for example, a row scanner 131, a horizontal selector 133, a column scanner 134, and a system controller 132.

The pixel region R1 includes, for example, the plurality of pixels P (light receiving element 1) arranged two-dimensionally in matrix. To the pixel P, for example, a pixel driving line Lread (e.g., a row selection line and a reset control line) is wired for each of pixel rows, and a vertical signal line Lsig is wired for each of pixel columns. The pixel driving line Lread transmits a drive signal for signal readout from the pixel P. One end of the pixel driving line Lread is coupled to an output end corresponding to each row of the row scanner 131.

The row scanner 131 is a pixel driver that is configured by a shift register, an address decoder, etc., and that drives, each of the pixels P in the pixel region R1 on a row basis, for example. A signal outputted from each of the pixels P of a pixel row selected and scanned by the row scanner 131 is supplied to the horizontal selector 133 through each vertical signal line Lsig. The horizontal selector 133 is configured by an amplifier, a horizontal selection switch, etc. provided for each vertical signal line Lsig.

The column scanner 134 is configured by a shift register, an address decoder, etc., and sequentially drives respective horizontal selection switches of the horizontal selector 133 while scanning. Signals of the respective pixels transmitted through corresponding vertical signal lines Lsig are sequentially outputted to a horizontal signal line 135, through selective scanning by the column scanner 134, and are inputted to an unillustrated signal processor, etc. through the horizontal signal line 135.

Figure 18:
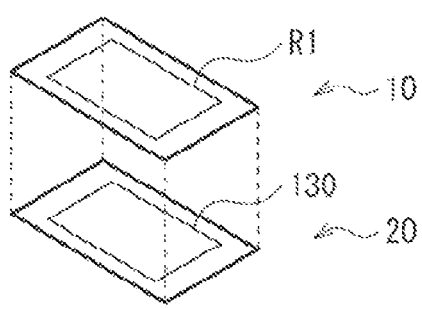
FIG. 18 is a schematic view illustrating a configuration example of a stacked-type solid-state imaging device.

In the imaging element 4, as illustrated in FIG. 18, for example, an element substrate 10 including the pixel region R1 and a circuit board 20 including a circuit section 130 are stacked. However, the present disclosure is not limited to such a configuration, and the circuit section 130 may be formed on the same substrate as the pixel region R1, or may be disposed on an external control IC. Further, the circuit section 130 may be formed on another substrate connected by cables or the like.

The system controller 132 receives a clock provided from outside, data to command an operation mode, etc., and also outputs data such as internal information on the imaging element 4. The system controller 132 further includes a timing generator that generates various timing signals, and performs driving control of the row scanner 131, the horizontal selector 133, the column scanner 134, etc., based on the various timing signals generated by this timing generator.

Application Example 2

Figure 19:
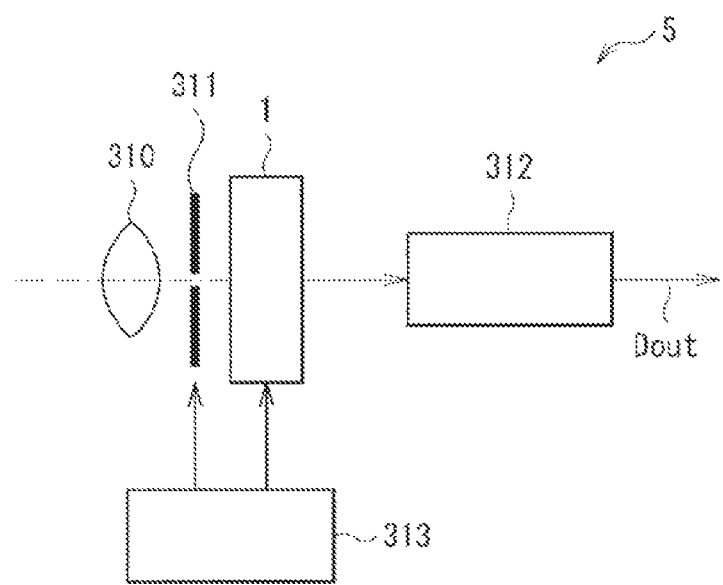
FIG. 19 is a functional block diagram illustrating an example of an electronic apparatus (camera) including the solid-state imaging device illustrated in FIG. 17.

The above-described imaging element 4 is applicable to various kinds of electronic apparatuses such as a camera that enables imaging of, for example, an infrared region. FIG. 19 illustrates a schematic configuration of an electronic apparatus 5 (a camera), as an example. This electronic apparatus 5 is, for example, a camera that is able to capture a still image or a moving image, and includes the imaging element 4, an optical system (an optical lens) 310, a shutter unit 311, a driver 313 that drives the imaging element 4 and the shutter unit 311, and a signal processor 312.

The optical system 310 guides image light (incident light) from a subject to the imaging element 4. This optical system 310 may be configured by a plurality of optical lenses. The shutter unit 311 controls a light irradiation period and a light shielding period for the imaging element 4. The driver 313 controls a transfer operation of the imaging element 4 and a shutter operation of the shutter unit 311. The signal processor 312 performs various kinds of signal processing, for a signal outputted from the imaging element 4. An image signal Dout after the signal processing is stored into a storage medium such as a memory, or outputted to a monitor, etc.

Application Example 3

Example of Application to In-Vivo Information Acquisition System

Further, the technology (present technology) according to the present disclosure is applicable to various products. For example, the technology according to the present disclosure may be applied to an endoscopic surgery system.

Figure 20:
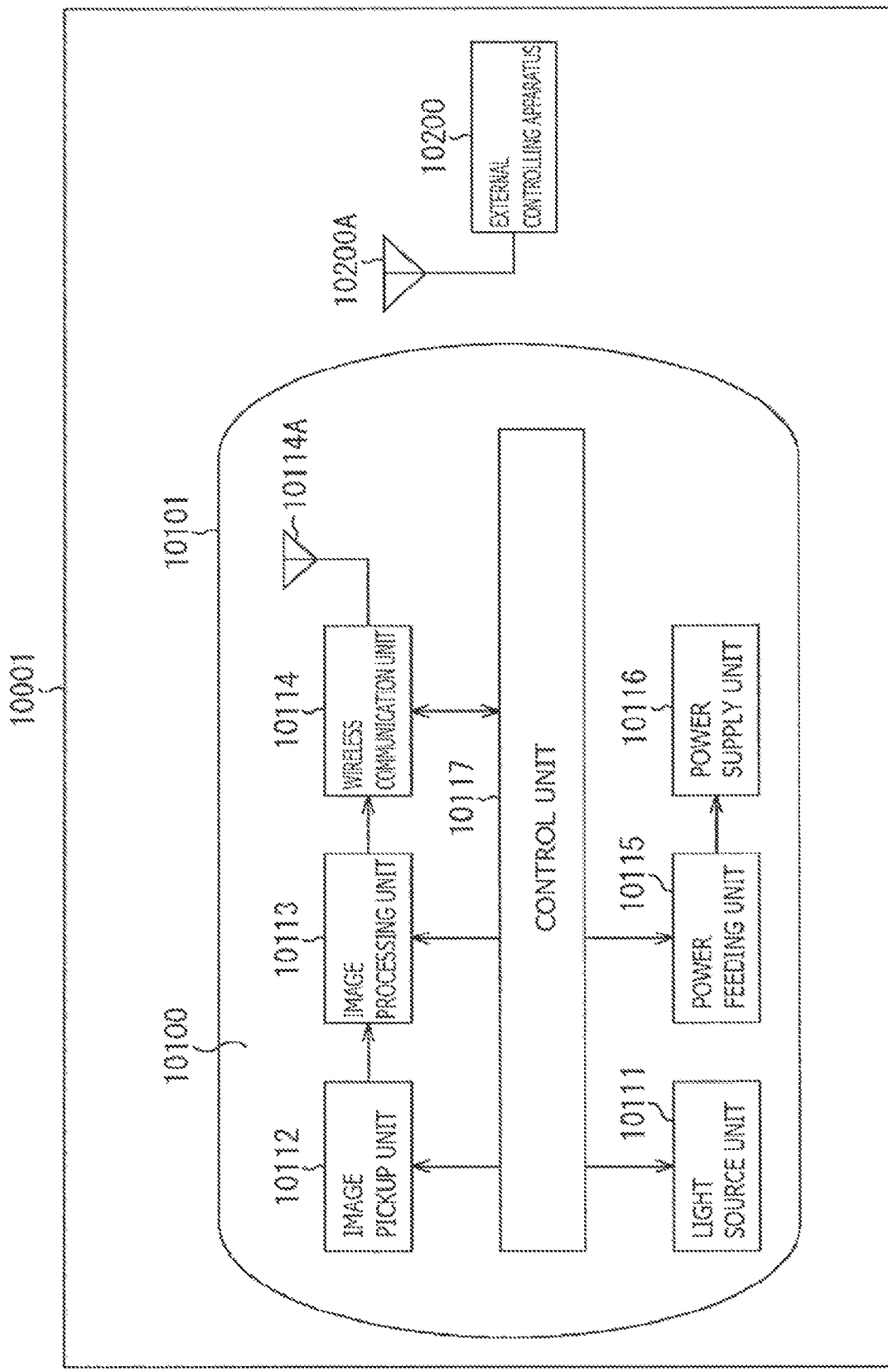
FIG. 20 is a block diagram depicting an example of a schematic configuration of an in-vivo information acquisition system.

FIG. 20 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 20, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure may be applied has been described above. The technology according to the present disclosure may be applied, for example, to the image pickup unit 10112 among the components described above. This makes it possible to increase the detection accuracy.

Application Example 4

4. Example of Application to Endoscopic Surgery System

The technology (present technology) according to the present disclosure is applicable to various products. For example, the technology according to the present disclosure may be applied to an endoscopic surgery system.

Figure 21:
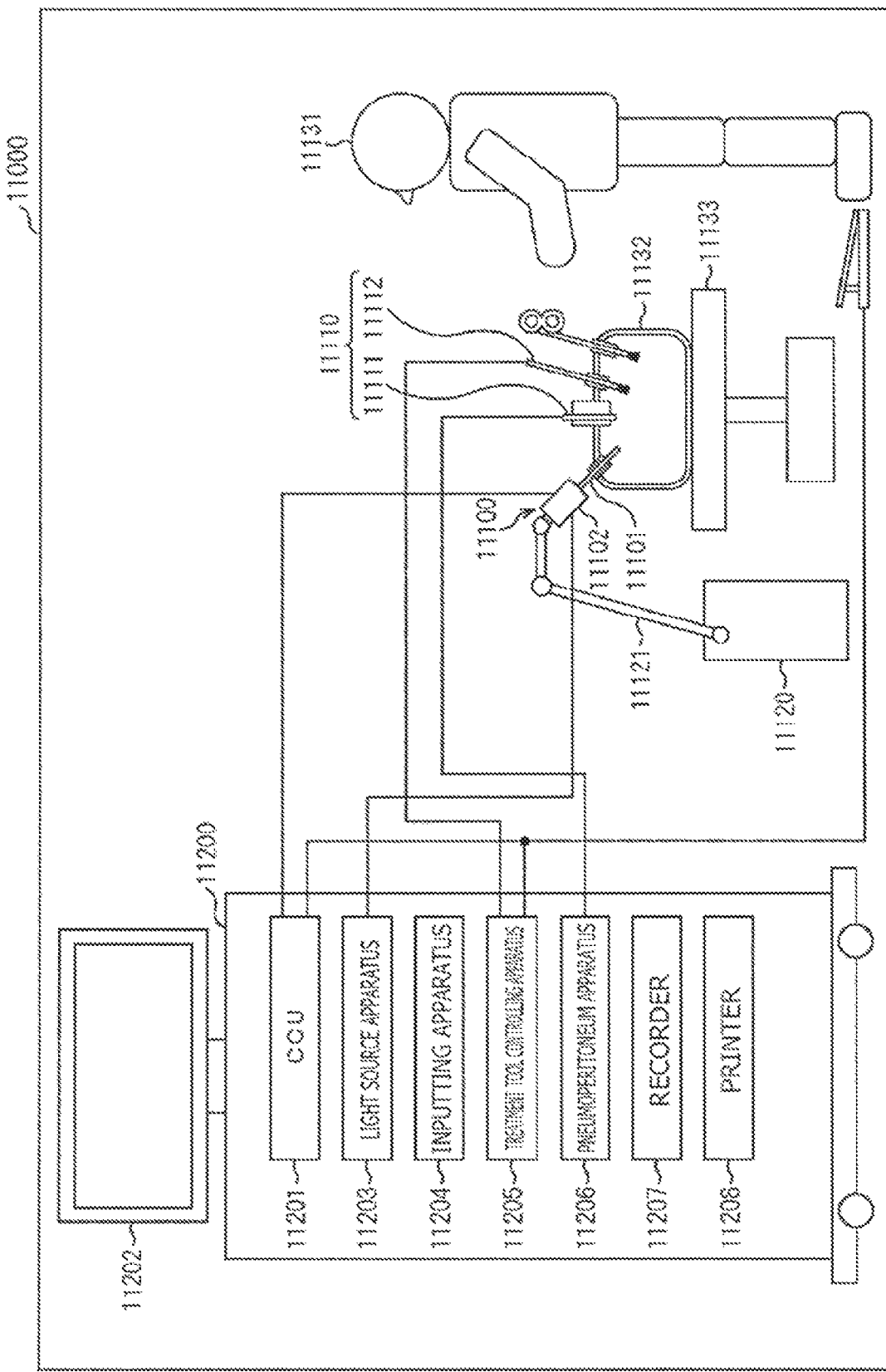
FIG. 21 is a view depicting an example of a schematic configuration of an endoscopic surgery system to which the present technology may be applied.

FIG. 21 is a view depicting an example of a schematic configuration of an endoscopic surgery system to which the technology according to an embodiment of the present disclosure (present technology) can be applied.

In FIG. 21, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 22:
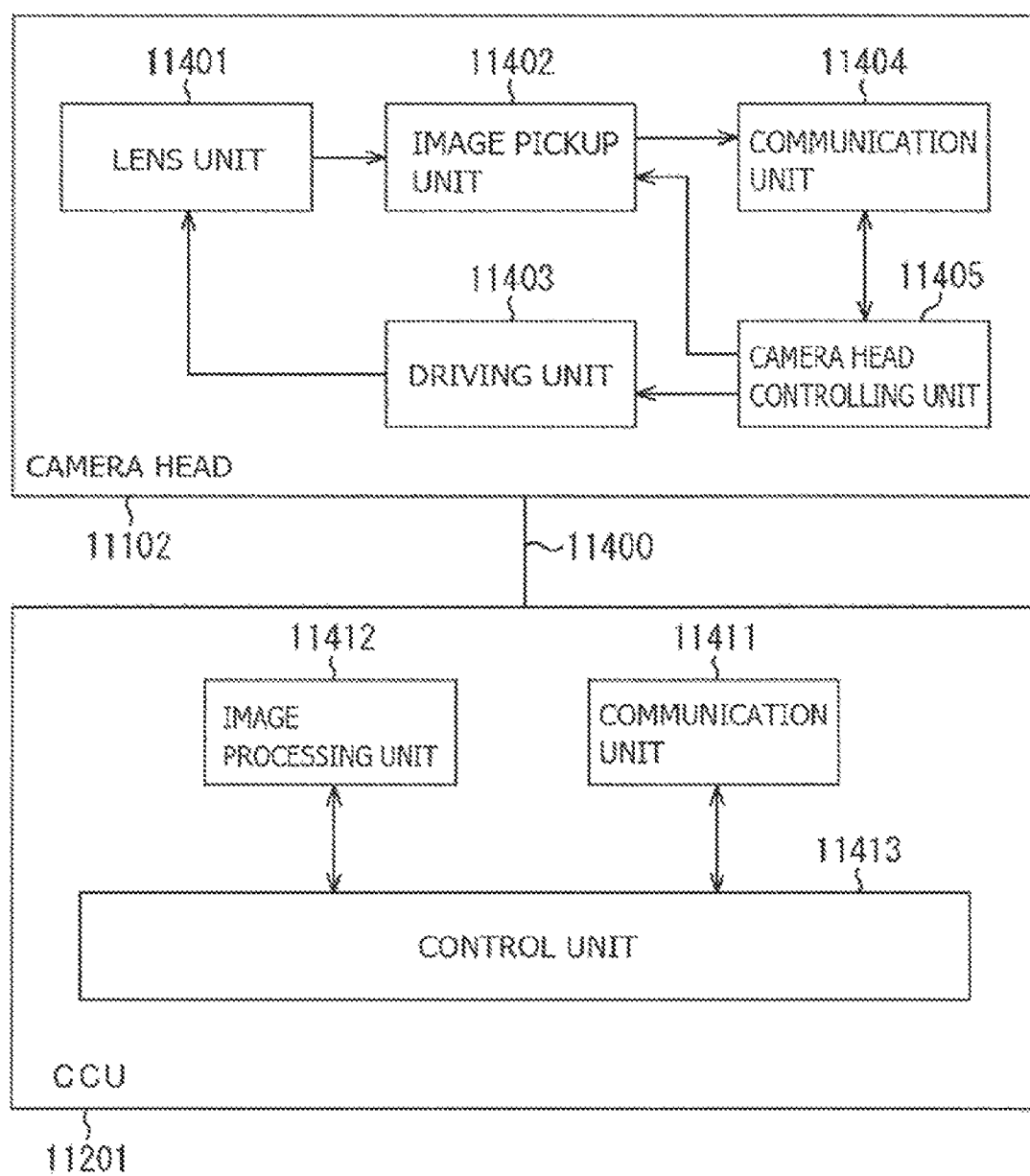
FIG. 22 is a block diagram depicting an example of a functional configuration of a camera head and a camera control unit (CCU) illustrated in FIG. 21.

FIG. 22 is a block diagram depicting an example of a functional configuration of the camera head 11102 and the CCU 11201 depicted in FIG. 21.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described above. The technology according to the present disclosure may be applied to the image pickup unit 11402 among the components described above. Applying the technology according to an embodiment of the present disclosure to the image pickup unit 11402 increases the detection accuracy.

It is to be noted that the endoscopic surgery system has been described here as an example, but the technology according to the present disclosure may be additionally applied to, for example, a microscopic surgery system or the like.

Application Example 5

Example of Application to Mobile Body

The technology according to the present disclosure is applicable to various products. For example, the technology according to the present disclosure may be achieved as a device mounted on any type of mobile body such as a vehicle, an electric vehicle, a hybrid electric vehicle, a motorcycle, a bicycle, a personal mobility, an airplane, a drone, a vessel, a robot, a construction machine, or an agricultural machine (tractor).

Figure 23:
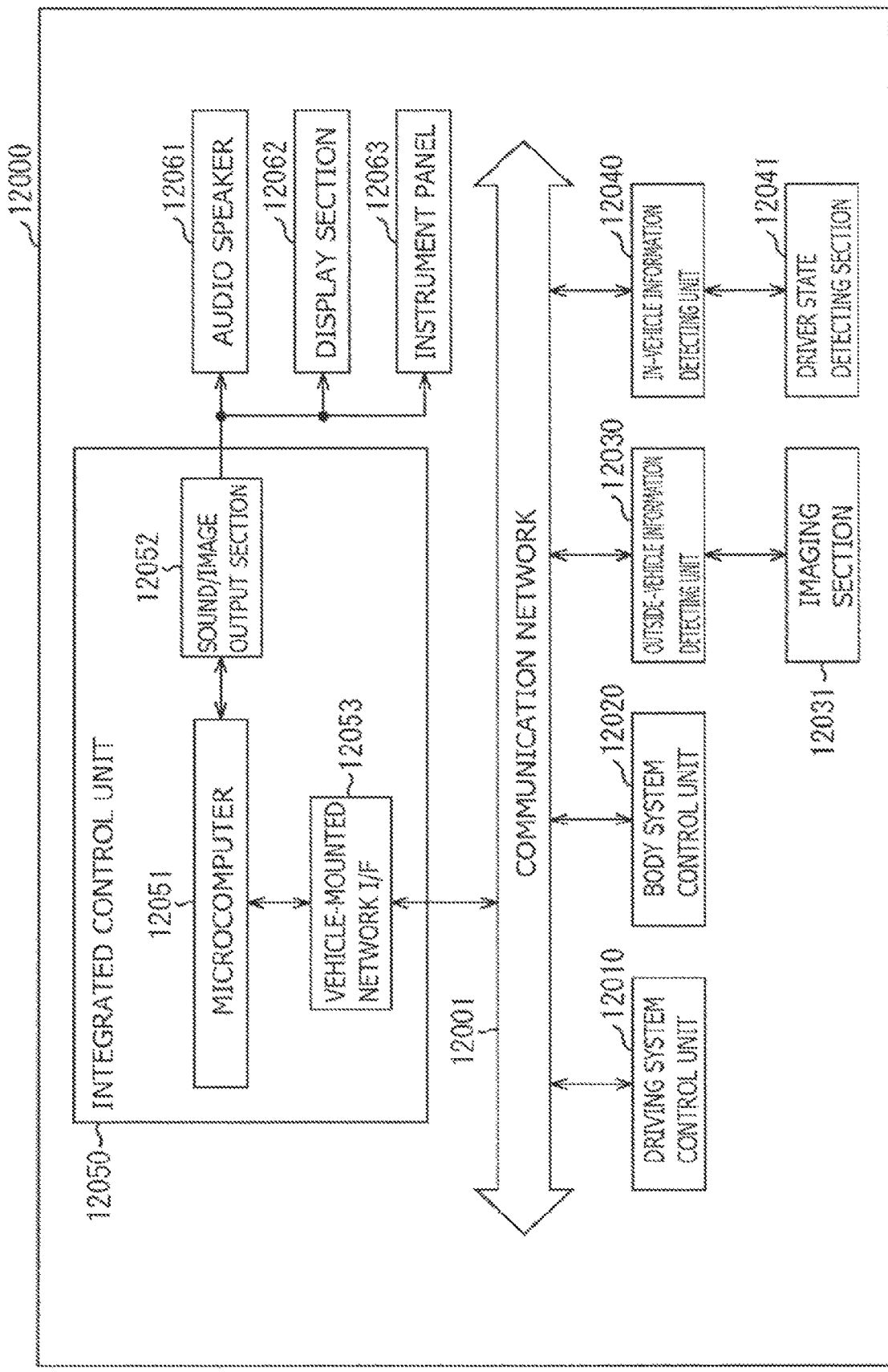
FIG. 23 is a block diagram depicting an example of schematic configuration of a vehicle control system.

FIG. 23 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 23, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 23, an audio speaker 12061, a display section 12062, and an instrument panel 12063 are illustrated as the output device. The display section 12062 may, for example, include at least one of an on-board display and a head-up display.

Figure 24:
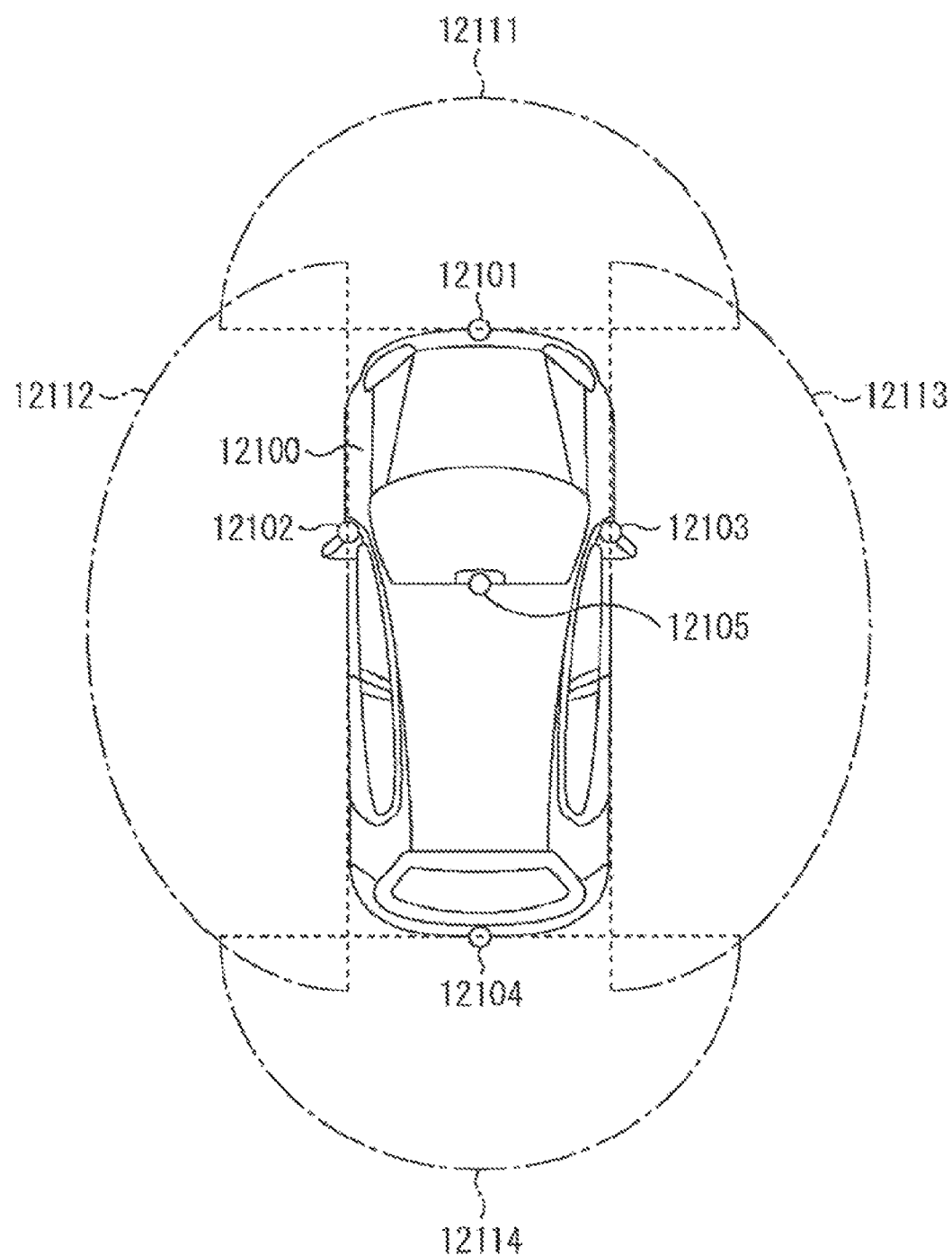
FIG. 24 is a diagram of assistance in explaining an example of installation positions of an outside-vehicle information detecting section and an imaging section.

FIG. 24 is a diagram depicting an example of the installation position of the imaging section 12031.

In FIG. 24, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 24 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Although the first and second embodiments, the modification examples 1 to 6, and the application examples have been described above, the present disclosure is not limited to the above-described embodiments and the like, and various modifications can be made. For example, the layer structures of the light receiving elements described in the above embodiments are examples, and other layers may be further provided. The materials and thicknesses of the respective layers are also examples and are not limited to those described above. For example, in the embodiments and the like described above, the case in which the photoelectric converter 10S includes the second contact layer 12, the photoelectric conversion layer 13, and the first contact layer 14; however, the photoelectric converter 10S only has to include the photoelectric conversion layer 13. For example, the second contact layer 12 and the first contact layer 14 may not necessarily be provided, or other layers may be included.

Further, in the embodiments and the like described above, for convenience, the case in which the signal charge is a hole; however, the signal charge may be an electron. For example, the diffusion region may include an n-type impurity. Further, the modification examples 1 to 6 described above may be used in combination with each other.

In addition, in the embodiments and the like described above, the light receiving element of one specific example of the semiconductor element according to the present technology has been described; however, the semiconductor element according to the present technology may be other than the light receiving element. For example, the semiconductor element according to the present technology may be a light emitting element.

In addition, the effects described in the above embodiments and the like described above are merely examples, and other effects may be achieved, or other effects may be further included.

It is to be noted that the present disclosure may have the following configurations.

1. A light receiving element including:
   a plurality of pixels;
   a photoelectric converter that is provided as a layer common to the plurality of pixels, and contains a compound semiconductor material; and
   a first electrode layer that is provided between the plurality of pixels on light incident surface side of the photoelectric converter, and has a light-shielding property.
2. The light receiving element according to (1), in which the first electrode layer includes a metal film having a light-shielding property.
3. The light receiving element according to (1) or (2), in which the first electrode layer has a stacked structure including a first semiconductor layer and a metal film, the metal film having a light-shielding property.
4. The light receiving element according to any one of (1) to (3), in which the first electrode layer has a lattice shape
5. The light receiving element according to any one of (1) to (4), in which the photoelectric converter includes a photoelectric conversion layer, a first contact layer provided between the photoelectric conversion layer and the first electrode layer, and a second contact layer provided on side, of the photoelectric conversion layer, opposite to the first contact layer.
6. The light receiving element according to (5), in which the second contact layer includes a first conduction-type region provided in a region that opposes each of the plurality of pixels, and a second conduction-type region around the first conduction-type region.
7. The light receiving element according to any one of (1) to (6), in which
   the light receiving element includes a pixel region in which the plurality of pixels is provided and a peripheral region provided outside the pixel region, and
   the first electrode layer is electrically coupled, at a perimeter of the pixel region, to a readout electrode provided in the peripheral region.
8. The light receiving element according to any one of (5) to (7), in which the photoelectric conversion layer absorbs a wavelength in at least an infrared region and generates electric charges.
9. The light receiving element according to any one of (3) to (8), in which a photoelectric conversion layer, a first contact layer, and a second contact layer that use the photoelectric converter, and the first semiconductor layer each include a III-V group semiconductor material.
10. The light receiving element according to (9), in which
    the photoelectric conversion layer and the first semiconductor layer each include InGaAs, and
    the first contact layer and the second contact layer each include InP or InGaAs.

11. A light receiving element including:
a plurality of pixels;
a photoelectric converter that includes a compound semiconductor material, is provided as a layer common to the plurality of pixels, and has a stacked structure in which a photoelectric conversion layer, a first contact layer, and a second contact layer are stacked, the photoelectric conversion layer being provided between the first contact layer and the second contact layer;
an insulating layer provided over the photoelectric converter; and
a transparent electrode layer provided over the insulating layer.

12. The light receiving element according to (11), further including a light-shielding film between the insulating layer and the transparent electrode layer or between the plurality of pixels provided over the transparent electrode layer.

13. The light receiving element according to (11) or (12), in which the insulating layer includes a carrier-induction film.

14. The light receiving element according to any one of (11) to (13), in which
the first contact layer is provided over light incident surface side of the photoelectric conversion layer, and has one conduction type, and
the second contact layer is provided on side, of the photoelectric conversion layer, opposite to the light incident surface, and has, inside a layer having one conduction type, a region of another conduction type for each of the pixels.

15. An electronic apparatus including
a light receiving element, the light receiving element including
a plurality of pixels,
a photoelectric converter that is provided as a layer common to the plurality of pixels, and contains a compound semiconductor material, and
a first electrode layer that is provided between the plurality of pixels on light incident surface side of the photoelectric converter, and has a light-shielding property.

16. An electronic apparatus including
a light receiving element, the light receiving element including
a plurality of pixels,
a photoelectric converter that includes a compound semiconductor material, is provided as a layer common to the plurality of pixels, and has a stacked structure in which a photoelectric conversion layer, a first contact layer, and a second contact layer are stacked, the photoelectric conversion layer being provided between the first contact layer and the second contact layer,
an insulating layer provided over the photoelectric converter, and
a transparent electrode layer provided over the insulating layer.

This application claims the benefit of Japanese Priority Patent Application JP2017-253637 filed with the Japan Patent Office on Dec. 28, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A light receiving element, comprising:
a plurality of pixels;
a photoelectric converter that includes a compound semiconductor material, is provided as a layer common to the plurality of pixels, and has a stacked structure in which a photoelectric conversion layer, a first contact layer, and a second contact layer are stacked, the photoelectric conversion layer being provided between the first contact layer and the second contact layer; and
an insulating layer provided over the photoelectric converter,
wherein the insulating layer includes a carrier-induction film.

2. The light receiving element according to claim 1, further comprising a light-shielding film provided above the first contact layer.

3. The light receiving element according to claim 2, further comprising an electrode layer provided above the first contact layer.

4. The light receiving element according to claim 3, further comprising a pixel region in which the plurality of pixels is provided and a peripheral region provided outside the pixel region.

5. The light receiving element according to claim 4, wherein the electrode layer includes a first electrode and a second electrode,
wherein the first electrode is provided over an entire surface of the pixel region and
wherein the second electrode is provided in the peripheral region.

6. The light receiving element according to claim 5, wherein the first electrode is a common electrode to the plurality of pixels and the second electrode is electrically coupled to the first contact layer.

7. The light receiving element according to claim 3, wherein the electrode layer is made of a transparent conductive material.

8. The light receiving element according to claim 7, wherein the transparent conductive material includes indium tin oxide (ITO).

9. The light receiving element according to claim 3, wherein the light-shielding film is provided over the electrode layer.

10. The light receiving element according to claim 3, wherein the light-shielding film is provided under the electrode layer.

11. The light receiving element according to claim 3, wherein the light-shielding film is provided between the insulating layer and the electrode layer.

12. The light receiving element according to claim 2, wherein the light-shielding film is provided between each of the plurality of pixels.

13. The light receiving element according to claim 1,
wherein the first contact layer is provided over a light incident surface side of the photoelectric conversion layer, and has one conduction type, and
wherein the second contact layer is provided on a side of the photoelectric conversion layer, opposite to the light incident surface, and has, inside a layer having one conduction type, a region of another conduction type for each of the pixels.

14. The light receiving element according to claim 1, wherein the photoelectric conversion layer absorbs a wavelength in at least an infrared region and generates electric charges.

15. The light receiving element according to claim 1,
wherein the photoelectric conversion layer includes indium gallium arsenide (InGaAs), and
wherein the first contact layer includes indium phosphorus (InP).

16. The light receiving element according to claim 1, wherein the photoelectric conversion layer, the first contact layer and the second contact layer each includes a III-V group semiconductor material.

17. The light receiving element according to claim 1, further comprising a color filter layer provided over the plurality of pixels.

18. The light receiving element according to claim 17, further comprising an on-chip lens layer provided over the color filter layer.

19. A light receiving element, comprising:
a plurality of pixels;
a photoelectric converter that includes a compound semiconductor material, is provided as a layer common to the plurality of pixels, and has a stacked structure in which a photoelectric conversion layer, a first contact layer, and a second contact layer are stacked, the photoelectric conversion layer being provided between the first contact layer and the second contact layer; and
an insulating layer provided over the photoelectric converter,
wherein the insulating layer includes a carrier-induction film, and
wherein the carrier-induction film is an insulating film containing at least one material selected from hafnium (HF), zirconium (Zr), aluminum (Al), tantalum (Ta), titanium (Ti), yttrium (Y) and lanthanides.

20. An electronic apparatus, comprising:
a light receiving element, the light receiving element including:
a plurality of pixels;
a photoelectric converter that includes a compound semiconductor material, is provided as a layer common to the plurality of pixels, and has a stacked structure in which a photoelectric conversion layer, a first contact layer, and a second contact layer are stacked, the photoelectric conversion layer being provided between the first contact layer and the second contact layer; and
an insulating layer provided over the photoelectric converter,
wherein the insulating layer includes a carrier-induction film.

* * * * *